(12) United States Patent
Hsueh et al.

(10) Patent No.: US 10,079,648 B2
(45) Date of Patent: *Sep. 18, 2018

(54) APPARATUS AND METHOD FOR MEASURING POWER SUPPLY NOISE

(71) Applicant: Intel Corporation, Santa Clara, CA (US)

(72) Inventors: Tzu-Chien Hsueh, Portland, OR (US); Frank O'Mahony, Portland, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 15/457,588

(22) Filed: Mar. 13, 2017

(65) Prior Publication Data

US 2017/0187476 A1 Jun. 29, 2017

Related U.S. Application Data

(63) Continuation of application No. 14/710,466, filed on May 12, 2015, now Pat. No. 9,596,037.

(51) Int. Cl.
*H04B 15/00* (2006.01)
*H04B 17/10* (2015.01)
*H04B 17/345* (2015.01)

(52) U.S. Cl.
CPC ......... *H04B 17/345* (2015.01); *H04B 15/005* (2013.01); *H04B 17/104* (2015.01)

(58) Field of Classification Search
CPC .............. G01R 31/31721; G01R 29/26; G01R 31/31708; G01R 31/282; G06F 2217/82; H04B 17/345; H04B 17/104; H04B 15/005

See application file for complete search history.

(56) References Cited

U.S. PATENT DOCUMENTS

| | | | |
|---|---|---|---|
| 5,517,534 A | 5/1996 | Knierim | |
| 5,757,240 A * | 5/1998 | Boerstler | H03K 3/0315 331/177 R |
| 7,116,114 B2 | 10/2006 | Kajita | |
| 7,355,435 B2 | 4/2008 | Ferraiolo | |

(Continued)

OTHER PUBLICATIONS

Oh et al., "In-Situ Characterization of 3D Package Systems with On-Chip Measurements", Jun. 2010, Electronic Components and Technology Conference (ECTC), 2010 Proceedings 60th, pp. 1485-1492.*

(Continued)

*Primary Examiner* — Sophia Vlahos
(74) *Attorney, Agent, or Firm* — Green, Howard & Mughal LLP

(57) ABSTRACT

Described is an apparatus which comprises: a power delivery distribution network (PDN) to provide a power supply to at least one circuit; and an on-die synchronous power supply noise injector to inject noise to the power supply on the PDN. Described is another apparatus which comprises: a PDN to provide power supply to various circuits; an on-die power supply noise (PSN) sampler to sample the power supply with an injected noise, wherein the PSN sampler to sample the power supply with at least two different clock signals; and a phase noise accumulator to randomize the periods of the at least two different clock signals.

21 Claims, 15 Drawing Sheets

(56) References Cited

U.S. PATENT DOCUMENTS

| | | | |
|---|---|---|---|
| 7,365,548 B2 | 4/2008 | Neuman | |
| 7,519,484 B2* | 4/2009 | Colman | G01R 19/2513 |
| | | | 315/291 |
| 7,702,009 B2 | 4/2010 | Akimoto | |
| 7,800,396 B2 | 9/2010 | Yamamoto | |
| 8,258,845 B1* | 9/2012 | Alexander | G06F 1/10 |
| | | | 327/291 |
| 8,497,694 B2 | 7/2013 | Chua-Eoan | |
| 8,659,310 B2 | 2/2014 | Eckert | |
| 8,928,334 B1 | 1/2015 | Raj | |
| 8,953,364 B2 | 2/2015 | Hollis | |
| 9,596,037 B2* | 3/2017 | Hsueh | H04B 15/005 |
| 2006/0036980 A1 | 2/2006 | Kobayashi | |
| 2006/0109895 A1 | 5/2006 | Watanabe | |
| 2007/0075701 A1 | 4/2007 | Wagner | |
| 2007/0164754 A1 | 7/2007 | Smith | |
| 2013/0275268 A1* | 10/2013 | Wright | G06Q 30/02 |
| | | | 705/26.61 |
| 2014/0114636 A1 | 4/2014 | Daloukas | |

OTHER PUBLICATIONS

Alon et al., "Circuits and Techniques for High-Resolution Measurement of on-Chip Power Supply Noise", Apr. 2005, IEEE Journal of Solid-State Circuits, pp. 820-828.*

Advisory Action dated Aug. 30, 2016,for U.S. Appl. No. 14/710,466.

Final Office Action dated Jun. 20, 2016 for U.S. Appl. No. 14/710,466.

Non Final Office Action for U.S. Appl. No. 14/710,466, dated Jan. 25, 2016.

Notice of Allowance, dated Nov. 9, 2016, for U.S. Appl. No. 14/710,466.

Alon, et al., "Circuits and Techniques for High-Resolution Measurement of on-Chip Power Supply Noise", Apr. 2005, IEEE Journal of Solid-State Circuits, pp. 820-828. p. 824, section B.

Alon, et al., "On-Die Power Supply Noise Measurement Techniques", May 2009, IEEE Transactions on Advanced Packaging, pp. 248-259.

Oh, et al., "In-Situ Characterization of 3D Package Systems With On-Chip Measurements", 2010—60thProceedings of the Electronic Components and Technology Conference (ECTC), Jun. 2010, pp. 1485-1492.

* cited by examiner

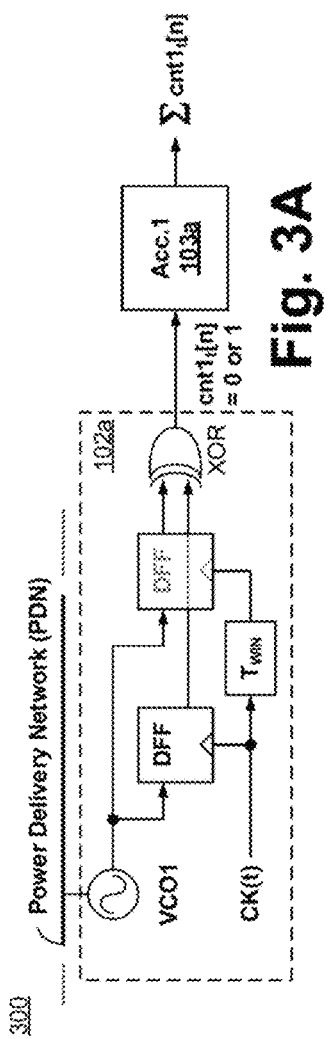
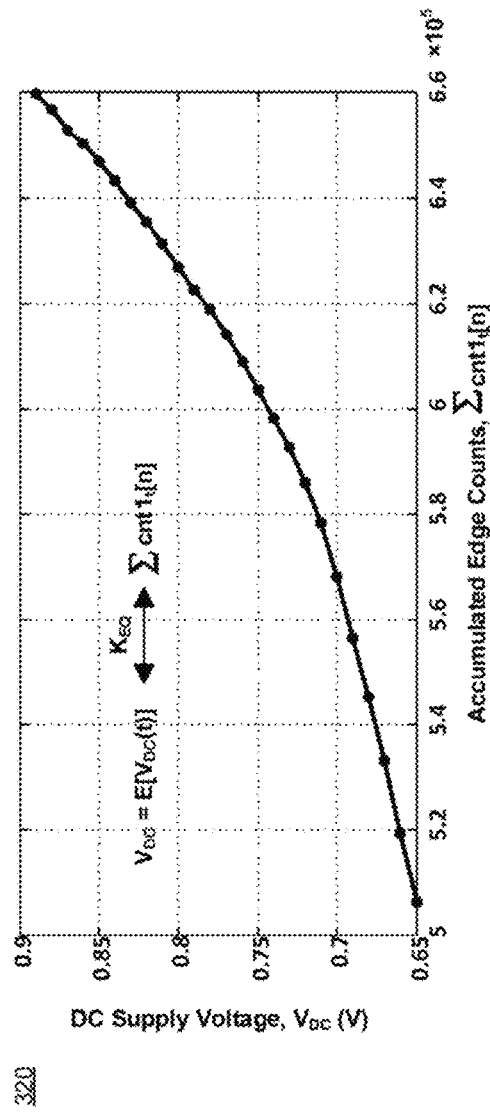

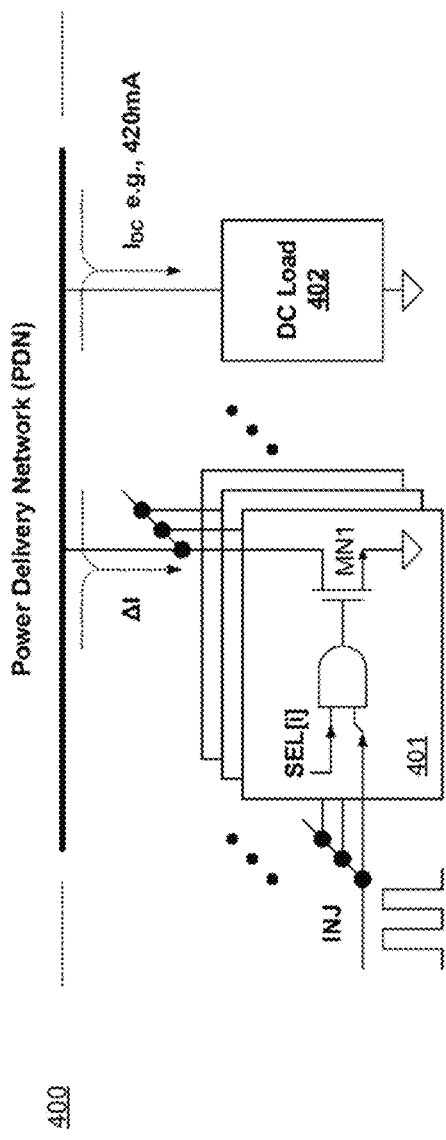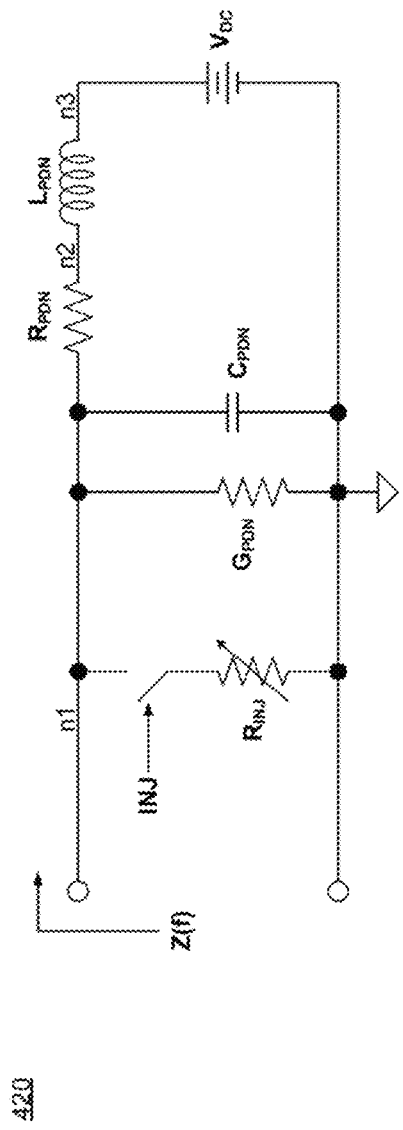
Fig. 4A
Fig. 4B

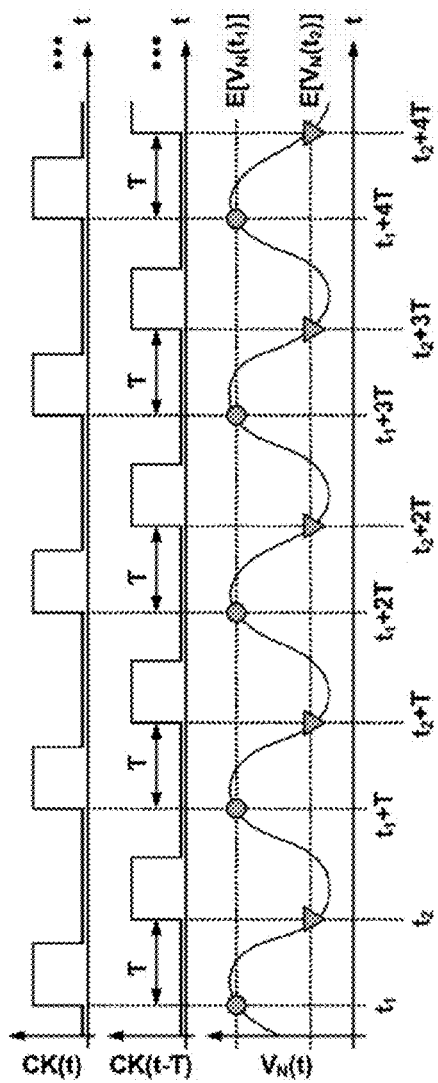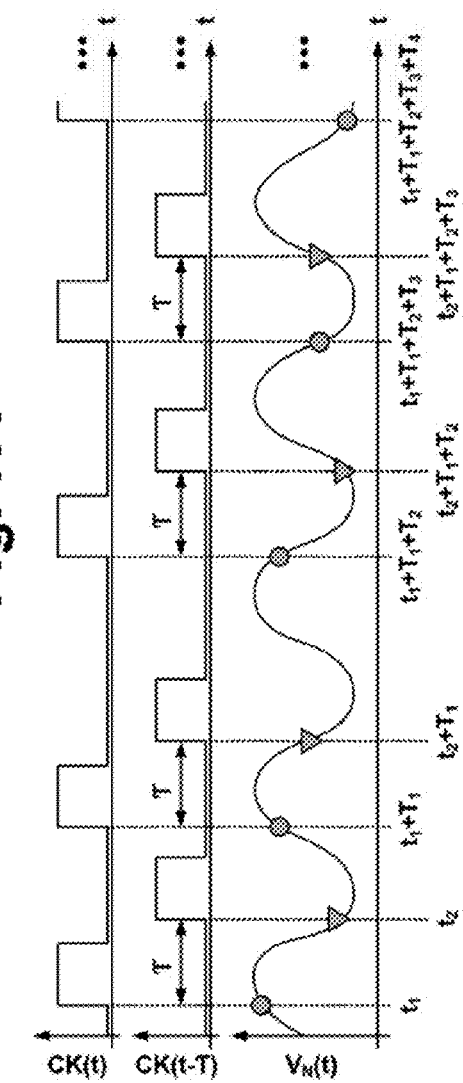

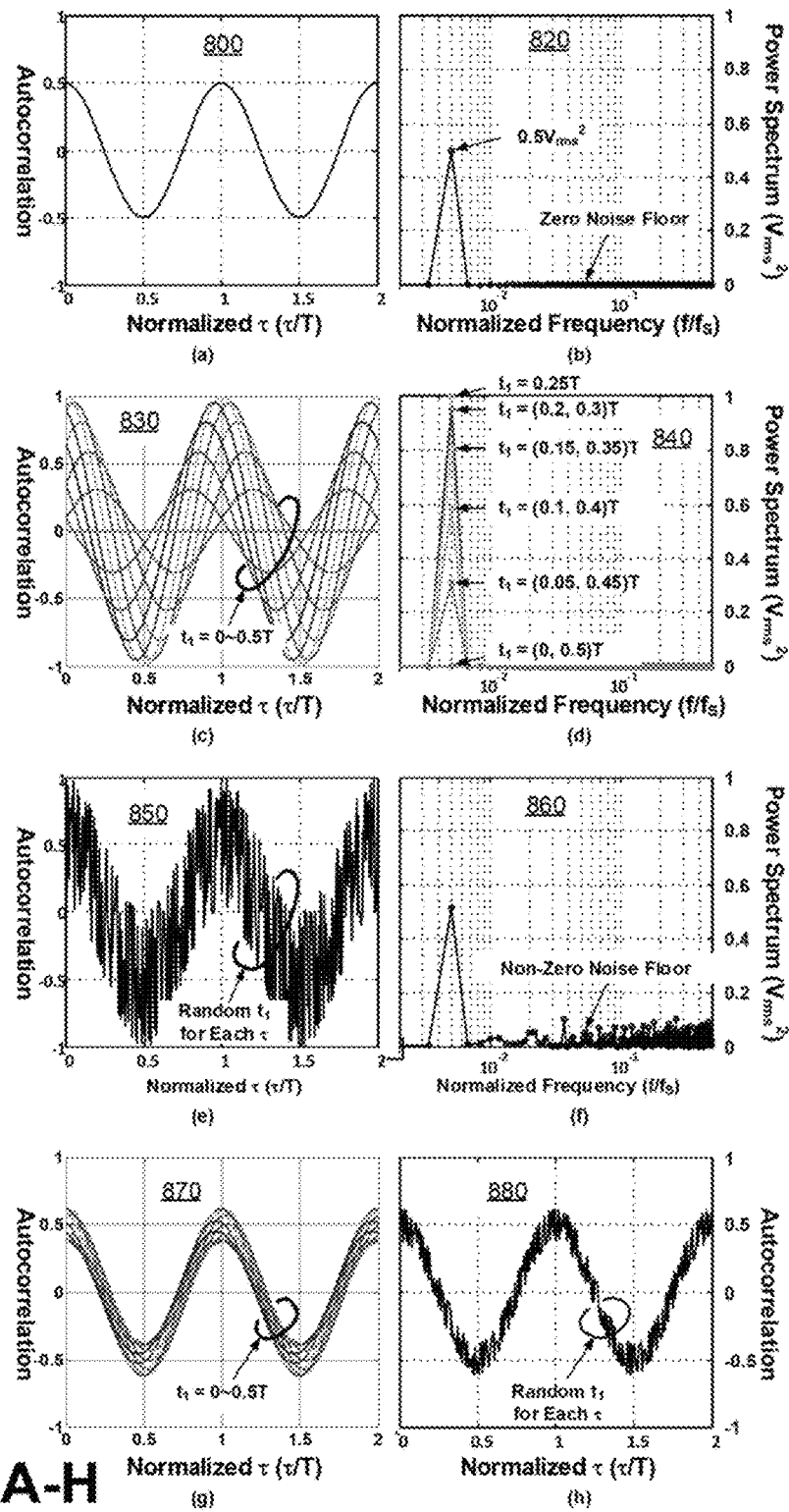
Figs. 8A-H

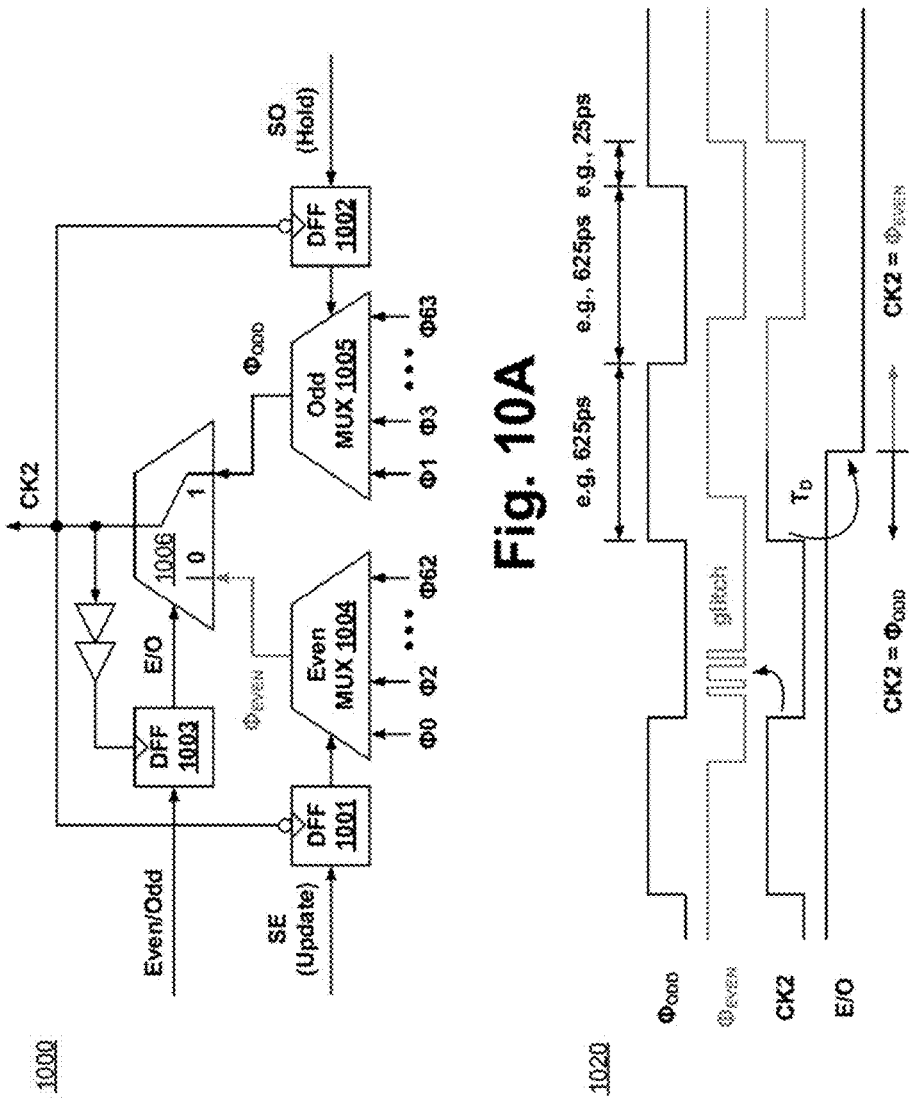

APPARATUS AND METHOD FOR MEASURING POWER SUPPLY NOISE

CLAIM OF PRIORITY

This application is a continuation of, and claims priority to, U.S. application Ser. No. 14/710,466, filed on May 12, 2015 and titled "APPARATUS AND METHOD FOR MEASURING POWER SUPPLY NOISE", which will issue as U.S. Pat. No. 9,596,037 on Mar. 14, 2017, which is incorporated by reference in its entirety for all purposes.

BACKGROUND

To compete in a variety of new and established market segments, Integrated Circuit (IC) products are targeting increasingly aggressive voltage and power constraints. The ability to design within these constraints depends crucially on how well engineers can model the Power Delivery Network (PDN), diagnose power supply noise related performance issues, and determine de-coupling capacitor and power bump requirements. Further, repeatability, accuracy, and testing time for high-volume measurements can directly impact product competitiveness, cost, and time to market. To do these tasks well, however, requires the ability to measure on-die Power Supply Noise (PSN) with high-accuracy and high-bandwidth.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIG. 3A illustrates an oscillator based analog to digital converter (ADC) for the PSN analyzer, according to some embodiments of the disclosure.

FIG. 3B illustrates a plot showing measured conversion curve between DC (Direct Current) supply voltage and accumulated edge counts associated with the oscillator based ADC for the PSN analyzer, according to some embodiments of the disclosure.

FIG. 4A illustrates an on-die PSN injector for the PSN analyzer, according to some embodiments of the disclosure.

FIG. 4B illustrates an impedance model of a power delivery network (PDN) with the PSN injector, according to some embodiments of the disclosure.

FIG. 7A illustrates waveforms showing the stationary process criteria violation due to frequency and phase synchronizations.

FIG. 7B illustrates waveforms showing phase noise integration on the sampling clocks to meet the stationary process criteria.

FIG. 8A illustrates a plot showing the ideal autocorrelation function of a normalized sine wave.

FIG. 8B illustrates a plot showing the ideal power spectrum of the normalized sine wave.

FIG. 8C illustrates a plot showing erroneous autocorrelation functions, of the normalized sine wave, due to frequency synchronization and deterministic phase variable.

FIG. 8D illustrates a plot showing erroneous power spectrums, of the normalized sine wave, due to frequency synchronization and deterministic phase variable.

FIG. 8E illustrates a plot showing the erroneous autocorrelation function, of the normalized sine wave, due to frequency synchronization and stochastic phase variable.

FIG. 8F illustrates a plot showing the erroneous power spectrum, of the normalized sine wave, due to frequency synchronization and stochastic phase variable.

FIG. 8G illustrates a plot showing autocorrelation functions, of the normalized sine wave, in which the correlation effects with a deterministic phase variable are suppressed by adding integrated phase noise, according to some embodiments.

FIG. 8H illustrates a plot showing the autocorrelation function, of a normalized sine wave, in which the correlation effects with a stochastic phase variable are suppressed by adding integrated phase noise, according to some embodiments.

FIG. 10A illustrates a circuit diagram of a glitch-free phase switching multiplexer of the time-base generator, according to some embodiments of the disclosure.

FIG. 10B illustrates a timing diagram of the glitch-free phase switching multiplexer, according to some embodiments of the disclosure.

DETAILED DESCRIPTION

Figure 1:
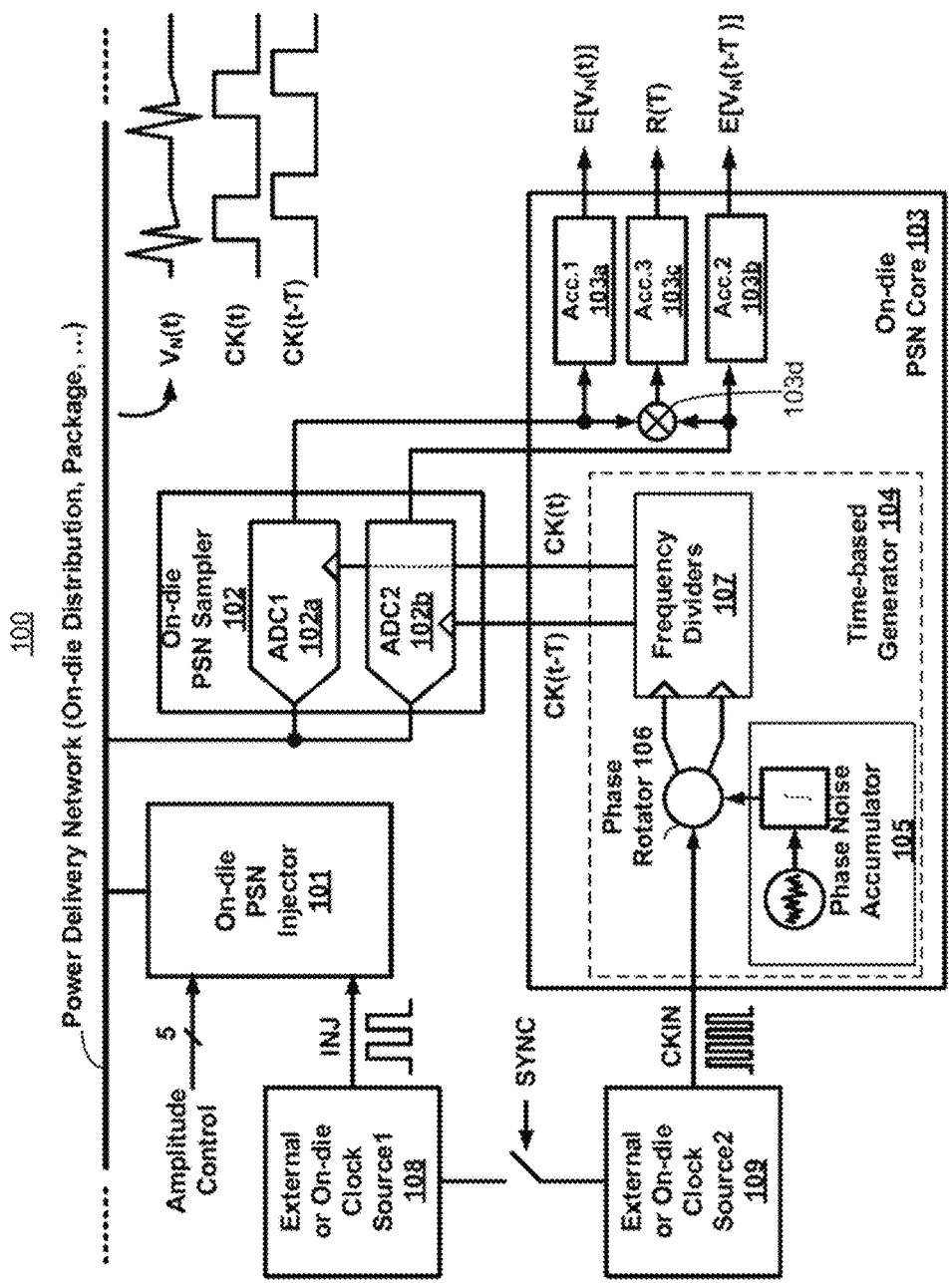
FIG. 1 illustrates a block diagram of a power supply noise (PSN) analyzer, according to some embodiments of the disclosure.

Some embodiments describe a scalable all-digital power supply noise (PSN) analyzer with a very high sampling bandwidth (e.g., 20 GHz) and a very fine resolution (e.g., 1 mV) for enabling low-cost low-power in-situ PSN measurements without dedicated clean supplies and clock sources. In some embodiments, the PSN analyzer is a subsampled averaging-based apparatus which measures PSN in both the equivalent-time and frequency domains with low resolution oscillator based analog to digital converters (ADCs). For example, voltage controlled oscillator (VCO) based ADCs are used for measuring PSN in both the equivalent-time and frequency domains.

In some embodiments, for equivalent-time measurements, the accurate impedance characterization of power delivery networks is performed by measuring a clock synchronized step response. In some embodiments, for frequency-domain measurements, the digital random phase-noise accumulation technique is analyzed and verified to overcome the clock-and-noise correlation issue in autocorrelation measurements. The PSN analyzer of some embodiments consumes negligible active and leakage powers because of the MHz-range sampling clock frequency and fully digital implementation with only hundreds of logic gates.

Commonly used techniques to measure supply noise have fundamental limitations in terms of resolution and bandwidth. Measuring the supply by probing the package facilitates by use of external measurement equipment represents a filtered version of the on-die PSN, especially above the package resonance frequency. This technique is not suitable for measuring PSN at specific locations on the die. Fast on-die comparators can provide real-time and droop-detection information based on a tunable voltage threshold but have limited voltage resolutions and cannot provide spectral information.

Other techniques that use a ring VCO to convert between voltage and frequency have the advantage of being process scalable. While integrating the VCO phase (e.g., counting VCO output clock edges) provides a digital measurement of the average voltage during the integration time window, such apparatus has a fundamental tradeoff between bandwidth and resolution that limits its accuracy at high-frequencies. The subsampled averaging technique may overcome each of these limitations and decouples bandwidth from accuracy. However, accurate measurement of the noise power spectrum with subsampled averaging and autocorrelation techniques requires time-based sampling clocks uncorrelated with any noise source on the PDN.

Some embodiments describe a PSN analyzer that incorporates a digital random phase-noise accumulation mechanism within the time-based generator to allow accurate power spectrum measurement without requiring a separate, uncorrelated time-base sampling-clock source. In some embodiments, instead of measuring PDN impedance by exhaustively injecting discrete noise frequency components, a method of characterizing the PDN impedance is provided in the frequency domain based on the step response of the PDN associated with the equivalent-time measurement and synchronized noise injection. In some embodiments, the PSN analyzer measures on-die equivalent-time noise waveforms and power spectrum as well as PDN impedance over a high bandwidth (e.g., 20 GHz) with sub-mV resolution (e.g., 1 mV or less).

In some embodiments, the PSN analyzer is implemented with almost fully digital CMOS standard-cell logic. In some embodiments, the PSN analyzer improves the power supply noise measurement capability by consolidating synchronous noise injectors and random phase-noise accumulation mechanism in the subsampled averaging technique. In some embodiments, the PSN analyzer not only maintains/improves achievable bandwidth and accuracy performances but also enables the possibilities of multiple-location on-die probing, time-efficient impedance characterization, high-volume, fully automatic, fully in-situ, and fast time-to-market measurements without requiring dedicated clean supplies and external clock sources.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical or magnetic connection between the things that are connected, without any intermediary devices. The term "coupled" means either a direct electrical or magnetic connection between the things that are connected or an indirect connection through one or more passive or active intermediary devices. The term "circuit" means one or more passive and/or active components that are arranged to cooperate with one another to provide a desired function. The meaning of "a," "an," and "the" include plural references. The meaning of "in" includes "in" and "on."

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level. The terms "substantially," "close," "approximately," "near," and "about," generally refer to being within +/−10% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

For purposes of the embodiments, the transistors in various circuits and logic blocks described here are metal oxide semiconductor (MOS) transistors, which include drain, source, gate, and bulk terminals. The transistors also include Tri-Gate and FinFET transistors, Gate All Around Cylindrical Transistors, Tunneling FET (TFET), Square Wire, or Rectangular Ribbon Transistors or other devices implementing transistor functionality like carbon nano tubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors—BJT PNP/NPN, BiCMOS, CMOS, eFET, etc., may be used without departing from the scope of the disclosure. The term "MN" indicates an n-type transistor (e.g., NMOS, NPN BJT, etc.) and the term "MP" indicates a p-type transistor (e.g., PMOS, PNP BJT, etc.).

FIG. 1 illustrates a block diagram of PSN analyzer 100, according to some embodiments of the disclosure. In some embodiments, PSN analyzer 100 comprises on-die PSN Injector 101, on-die PSN Sampler 102, and on-die PSN Core 103.

In some embodiments, on-die PSN Injector 101 is a digital to analog converter (DAC) based noise injector. In some embodiments, DAC based noise injector is combined with a pattern generator (e.g., external or on-die Clock Source1 108) that can inject various noise frequencies and amplitudes on the PDN. Here, the injected noise is indicated by the waveform $V_N(t)$. In some embodiments, on-die PSN Injector 101 receives an Amplitude Control signal (e.g., a 5-bit signal) to control the amplitude of the injected noise on PDN. For example, depending on the bit code of the 5-bit signal, amplitude of the injected noise can be increased or decreased.

In some embodiments, a synchronization (SYNC) switch is provided to synchronize the injected clock (INJ) and an input clock (CKIN) for on-die PSN Core 103. In some embodiments, the input clock CKIN is generated internally by a clock generation source (e.g., a phase locked loop). In some embodiments, the input clock CKIN is provided by an external clock source (e.g., On-die or External Clock Source2 109). In some embodiments, by enabling or disabling the SYNC switch, synchronization between the analyzer reference clock CKIN and the injector input INJ is enabled or disabled. As such, PSN analyzer 100 can perform equivalent-time waveform and PDN impedance or power spectrum measurements. For example, when the SYNC switch is enabled (i.e., closed or turned on), equivalent-time waveform or PDN impedance measurements are performed, and when the SYNC switch is disabled (i.e., open or turned off) power spectrum measurements are performed.

In some embodiments, on-die PSN Sampler 102 includes two low-resolution oscillator based ADCs-ADC1 102a and ADC2 102b. In some embodiments, the oscillator based ADCs are VCO based ADCs. In some embodiments, either one of the ADCs (i.e., ADC1 102a or ACD2 102b) can be used for equivalent-time waveform measurements while autocorrelation measurements (i.e., power spectrum measurements) may use two ADCs working simultaneously.

In some embodiments, on-die PSN Core 103 comprises accumulators (Acc.) Acc. 1 103a, Acc. 2 103b, and Acc. 3 103c, multiplier 103d, and Time-based Generator 104. In some embodiments, Time-based Generator 104 comprises a Phase Noise Accumulator 105, Phase Rotator 106, and Frequency Dividers 107. In some embodiments, Time-based Generator 104 generates sampling clocks CK(t) and CK(t–τ) for ADC1 102a and ADC2 102b, respectively.

In some embodiments, the phase difference between the sampling clocks, CK(t) and CK(t–τ), defines the autocorrelation function time variable, τ. In some embodiments, the minimal time step size, $T_{LSB}$, of τ determines the maximal equivalent sampling bandwidth of PSN analyzer 100 (where Nyquist frequency=$0.5/T_{LSB}$). In some embodiments, the $T_{LSB}$ is implemented by Phase Rotator 106 of on-die PSN Core 103.

In some embodiments, Time-based Generator 104 in on-die PSN Core 103 generates proper noise sampling clocks CK(t) and CK(t–τ) in terms of frequency, phase relationship, and data averaging cycles for both equivalent-time and autocorrelation measurements. In some embodiments, the digital phase-noise accumulation mechanism is enabled in autocorrelation measurements. In some embodiments, the outputs of on-die PSN Sampler 102 as well as their product (generated by multiplier 103d) are respectively accumulated by the on-die counter-based accumulators, Acc.1 103a, Acc.2 103b, and Acc.3 103c, in on-die PSN Core 103 to speed up the data acquisition time in this subsampled averaging system.

In some embodiments, the outputs of accumulators 103a/b/c represent the measured PSN time-domain expected values, $E[V_N(t)]$ and $E[V_N(t–τ)]$, and autocorrelation function, $R(τ)$, with their own conversion factors. In some embodiments, by de-multiplexing both CK(t) and CK(t–τ), a single PSN Core 103 can support time-division measurements with multiple PSN samplers which are compact and can be distributed to any on-die location of a processor. As such, the area and power overheads due to PSN Core 103 can be reduced or minimized without limiting reachable on-die probing points.

Figure 2:
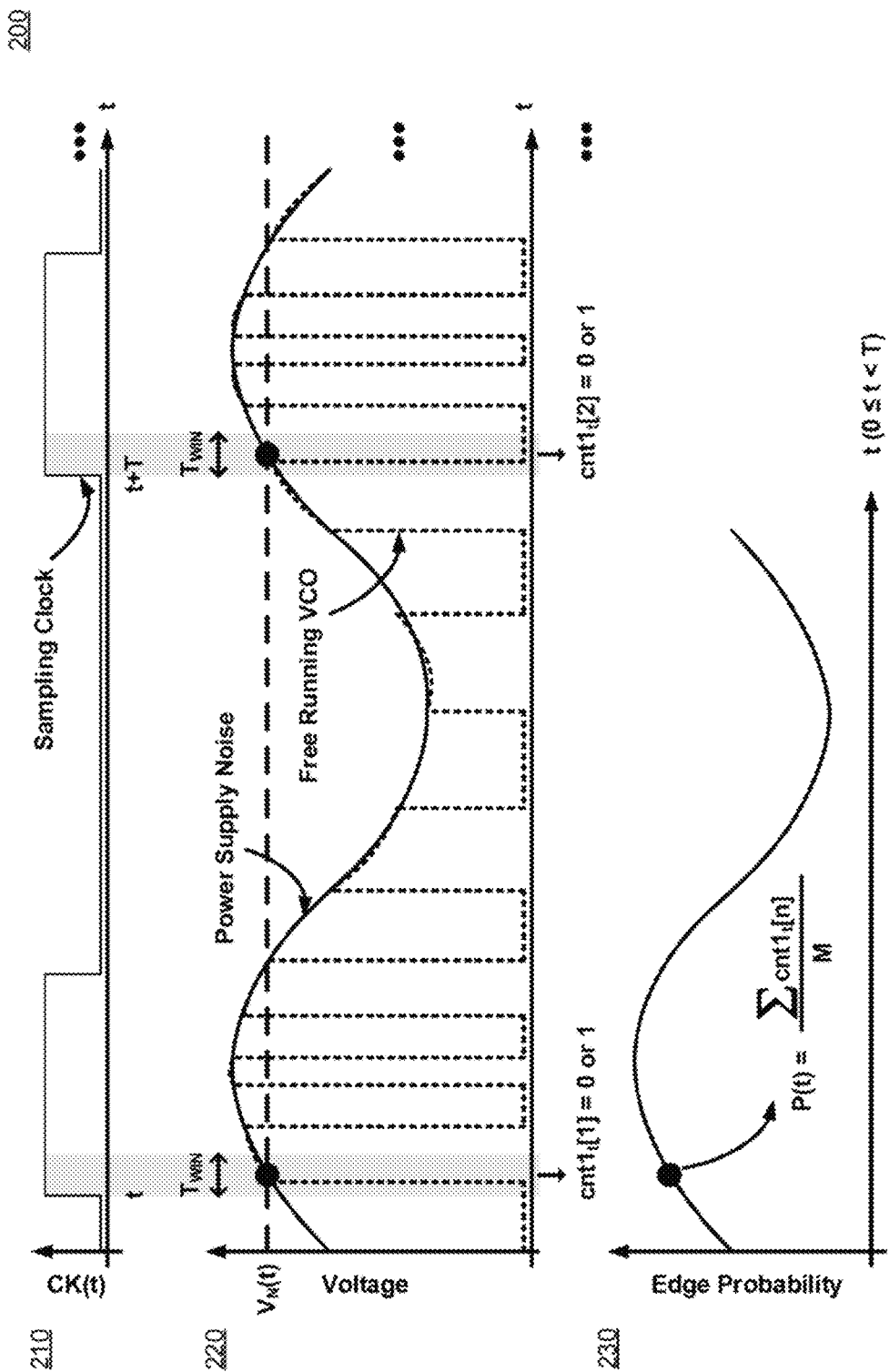
FIG. 2 illustrates waveforms for equivalent-time measurement with the sub sampled averaging technique, according to some embodiments of the disclosure.

FIG. 2 illustrates waveforms 200 for equivalent-time measurement with the sub sampled averaging technique, according to some embodiments of the disclosure. It is pointed out that those elements of FIG. 2 having the same reference numbers (or names) as the elements of any other figure can operate or function in any manner similar to that described, but are not limited to such. Here, x-axis is time and y-axis is logic state and voltage for waveforms 210 and 220, respectively, and Edge Probability for waveform 230.

The equivalent-time measurement reconstructs a repetitive voltage waveform by collecting the statistics result (i.e., averaging) of each sampling point of the noise waveform $V_N(t)$ on the PDN. In some embodiments, the statistical data collection process (i.e., subsampling) can be done in a periodic but very slow manner compared to the signal frequency under the measurement. As such, this measurement approach is also referred to as subsampled averaging technique. To correctly collect statistical data over a large amount of subsampled points, the measured signal and sampling clock are synchronous to hold their phase and frequency relationships, according to some embodiments.

From the sampling-theory perspective, a high equivalent sampling frequency ($f_S$=2·Nyquist frequency) is achievable by implementing a high resolution time-domain step size, $T_{LSB}$ (=$1/f_S$), between one sampling point and its next regardless the sampling clock frequency. Any frequency component within the Nyquist frequency having a zero-mean and uncorrelated with the sampling clock frequency is effectively filtered out by the averaging process. That is, the statistical scattering or standard deviation of each sampling point is reduced with an increasing amount of collected data (or subsampled) points. In some embodiments, thermal noise inherent to on-die PSN Sampler 102 can be reduced by the averaging process. In some embodiments, the signal distortion due to sampling clock jitter is negligible in the PSN measurements because of the low PDN bandwidth (e.g., within a few hundreds of MHz).

Waveform 220 shows an example of reconstructing PSN waveform, $V_N(t)$, in the equivalent-time measurement with a 1-bit VCO-based ADC as on-die PSN Sampler 102a shown in FIG. 3A. Referring back to FIG. 2, to simplify the illustration, the periodic PSN and the sampling clock, CK(t), are at the same frequency. Since the free-running VCO frequency varies with the amplitude of the supply voltage, higher supply voltages make the VCO output have more transition edges within a certain time duration, according to some embodiments. In some embodiments, on-die PSN Sampler 102a is based on detecting the VCO output transition probability, P(t), within a small time window, $T_{WIN}$.

In some embodiments, higher P(t) reflects higher supply voltage. In some embodiments, each subsampled datum, $cnt1_t[n]$, is obtained from the 1-bit ADC output showing '0' or '1' based on if any transition occurred within the $T_{WIN}$. In some embodiments, P(t) can then be calculated by averaging the accumulation result of the sub sampled data.

FIG. 3A illustrates an oscillator based ADC 300 for PSN analyzer 100, according to some embodiments of the disclosure. It is pointed out that those elements of FIG. 3A having the same reference numbers (or names) as the elements of any other figure can operate or function in any manner similar to that described, but are not limited to such.

In some embodiments, the oscillator based ADC 300 (or sampler) is a VCO based ADC which includes VCO1, sampling flip-flops (DFF), time delay unit $T_{WIN}$, exclusive-OR (XOR) logic gate, and Acc. 1 103a coupled together as shown. In some embodiments, DFFs are clocked by CK(t) and its delayed version. The outputs of the two DFFs are then compared by the XOR logic gate that provides the count $cnt1_t[n]$. In some embodiments, the accumulators (e.g., Acc. 1/2/3) are implemented by a 20-bit digital adder with a 20-bit feedback delay element (e.g., data flip-flops DFFs). In other embodiments, other circuits may be used for implementing the accumulators. In some embodiments, the quantization noise, $V_Q(t)$, of ADC 300 is embedded in $cnt1_t[n]$ and filtered out by the averaging process. In some embodiments, the equivalent-time voltage, $V_{EQ}(t)$, can be represented as:

$$V_{EQ}(t) = E[V_N(t)] = E[V_N(t) + V_Q(t)] \qquad (1)$$
$$= \frac{1}{K_{VCO}T_{WIN}} \cdot P(t) = \frac{1}{K_{VCO}T_{WIN}M} \cdot \sum_{n=1}^{M} cnt1_t[n] = K_{EQ} \cdot \sum_{n=1}^{M} cnt1_t[n]$$

where 'M' is the number of the subsampled points, $K_{VCO}$ (in Hz/V) is the VCO gain, and $K_{EQ}$ is the total conversion gain between accumulated edge numbers and equivalent voltages. $K_{EQ}$ can be obtained by calibrating the accumulator outputs versus DC supply voltages as shown in FIG. 3B.

FIG. 3B illustrates plot 320 showing measured conversion curve between DC supply voltage and accumulated edge counts associated with the oscillator based ADC 300 for PSN analyzer 100, according to some embodiments of the disclosure. It is pointed out that those elements of FIG. 3B having the same reference numbers (or names) as the elements of any other figure can operate or function in any manner similar to that described, but are not limited to such. Here, x-axis is Accumulated Edge Counts and y-axis is DC Supply Voltage $V_{DC}(V)$.

In some embodiments, the conversion curve is a measured curve and is obtained by disabling the circuits coupled to PDN in a chip and sweeping the DC supply of the PDN across the range of interest, and the slope of this curve is $K_{EQ}$. Here, the DC voltage drop due to PSN analyzer 100 itself may be negligible (e.g., less than 0.4 mV) based on the measured PDN series resistance. In some embodiments, every low-resolution VCO-based ADC distributed over the entire processor has to follow the same calibration process individually.

In some embodiments, the sampling bandwidth of the sampler in FIG. 3A is determined by $T_{WIN}$ (implemented by an RC delay). In this example, the RC delay is approximately 20 ps=1/50 GHz. In other examples, other values for the RC delay may be used. In some embodiments, the values for R (resistance) and C (capacitance) are set so that $T_{WIN}$ is short enough such that the supply voltage is essentially constant over $T_{WIN}$ even with the presence of noise. In some cases, the VCO maximum frequency may have one transition within $T_{WIN}$ to avoid incorrect edge detections.

In some cases, the non-constant slope ($K_{EQ}$) or conversion sensitivity is primarily due to the $K_{VCO}$ variation under various DC supply voltage. In some embodiments, in order to increase the sensitivity or speed up the averaging process, multiple output phases of the free-running VCO (e.g., 5-stage VCO outputs) can be utilized to check edge transitions as shown with reference to FIG. 6A. In some embodiments a local adder is used to summarize the multiple edge detections per subsample before the accumulation. This local adder may be a minor overhead since the sampling clock, CK(t), frequency is in the range of a Mega Hertz (MHz).

FIG. 4A illustrates an on-die PSN injector 400 (e.g., model of 101) for PSN analyzer 100, according to some embodiments of the disclosure. It is pointed out that those elements of FIG. 4A having the same reference numbers (or names) as the elements of any other figure can operate or function in any manner similar to that described, but are not limited to such.

In some embodiments, on-die PSN injector 400 comprises a digital-to-analog converter (DAC) 401 that receives the injector input INJ (e.g., a synchronized clock) and causes a current draw ($\Delta I$) from the PDN. As such, a step current is injected into the PDN and the noise is then sampled by PSN Sampler 102. A simplified impedance model of the PDN with PSN Injector 101 is illustrated in FIG. 4B. Referring back to FIG. 4A, in some embodiments, PSN Injector 101 can be used to mimic a digital circuit sinking current from the PDN. For example, PSN Injector 101 can be used to mimic DC Load 402 sinking $I_{DC}$=420 mA.

In some embodiments, in the equivalent-time measurement mode of PSN analyzer 100, the reference clock (CKIN) and injector input (INJ) (also shown in FIG. 1) are synchronized externally. With proper frequency configurations of CKIN and INJ, in some embodiments, Time-based Generator 104 can provide sampling clock CK(t), based on the noise-synchronized reference clock CKIN, to subsample the repetitive noise voltage waveform generated from PSN injector 400/101 based on INJ.

In some embodiments, for each sampling point, the accumulator (e.g., Acc.1 103a) accumulates the ADC output (i.e., output of ADC1 102a) over 'M' sub sampling cycles. In some embodiments, the voltage expectation of each sampling point is obtained by dividing the accumulated edge number by 'M.' In some embodiments, after averaging, the Time-based Generator 104 shifts the sampling clock phase by $T_{LSB}$ to measure the average voltage of the next sampling point. Meanwhile, in some embodiments, the accumulator output is recorded and reset to restart the edge accumulation.

Equivalent-time measurements associated with a synchronized PSN injector can enable a simple and accurate measurement approach for PDN impedance characterizations, according to some embodiments. The PDN impedance, Z(f), is the transfer function between the voltage response of the PDN and its input current. To measure the step response of the PDN, INJ can be a very low frequency clock signal such that PSN injector 400/101 offers a periodic current step for subsampled averaging. As long as the current step frequency is much lower (e.g., less than 0.1×) than the resonant frequency of the PDN, each current pulse can be treated as a single current step from the PDN standpoint.

Therefore, the PDN voltage step response can be reconstructed by sub sampling this persistent waveform due to the periodic current step injection, in accordance with some embodiments. In some embodiments, once the PDN step response has been measured, the PDN impedance transfer function can be extracted by calculating the Discrete-time Fourier Transform of the impulse response which is derived from the differentiated step response. In some embodiments, logic in the processor having the on-die PSN analyzer, is operable to perform differentiation of the step response and to perform Discrete-time Fourier Transform of the impulse response. In some embodiments, a software program (i.e., machine executable instructions) being executed on the processor performs the process of differentiation of the step response and Discrete-time Fourier Transform of the impulse response.

In realistic operations, the PDN impedance is also a function of the entire circuitry resistance. In some embodiments, the effective impedance, Z(f), of the PDN varies with INJ value since the resistance PSN Injector 400/101 from the supply to ground is time-variant due to ON and OFF behaviors of the ideal switch.

FIG. 4B illustrates an impedance model 420 of the PDN using PSN Injector 400/101, according to some embodiments of the disclosure. It is pointed out that those elements of FIG. 4B having the same reference numbers (or names) as the elements of any other figure can operate or function in any manner similar to that described, but are not limited to such.

In some embodiments, impedance model 420 includes the time-variant resistance $R_{INJ}$ which is made time-variant using switch controlled by INJ. The time-variant resistance $R_{INJ}$ and the switch controlled by INJ are coupled in series between ground and node n1 (where node n1 is the power supply node). Other elements of impedance model 420 includes resistance of PDN $R_{PDN}$, inductance of PDN $L_{PDN}$, capacitance of PDN $C_{PDN}$ and conductance of PDN $G_{PDN}$. In some embodiments, $R_{PDN}$ is coupled in series with $L_{PDN}$ such that one terminal of $R_{PDN}$ is coupled to node n1 and another terminal of $R_{PDN}$ is coupled to node n2. In some embodiments, one terminal of $L_{PDN}$ is coupled to node n2 and another terminal of $L_{PDN}$ is coupled to node n3. In some embodiments, node n3 is biased by a DC voltage source $V_{DC}$. In some embodiments, $C_{PDN}$ and $G_{PDN}$ are coupled to nodes n1 and ground such that they are parallel to the series coupled INJ switch and $R_{INJ}$.

In some embodiments, PSN analyzer 100 can extract different impedance responses due to various circuit resistances emulated by the tunable PSN current injection strength controlled by the selection signal, SEL[i], of each injector of FIG. 4A.

Figure 5:
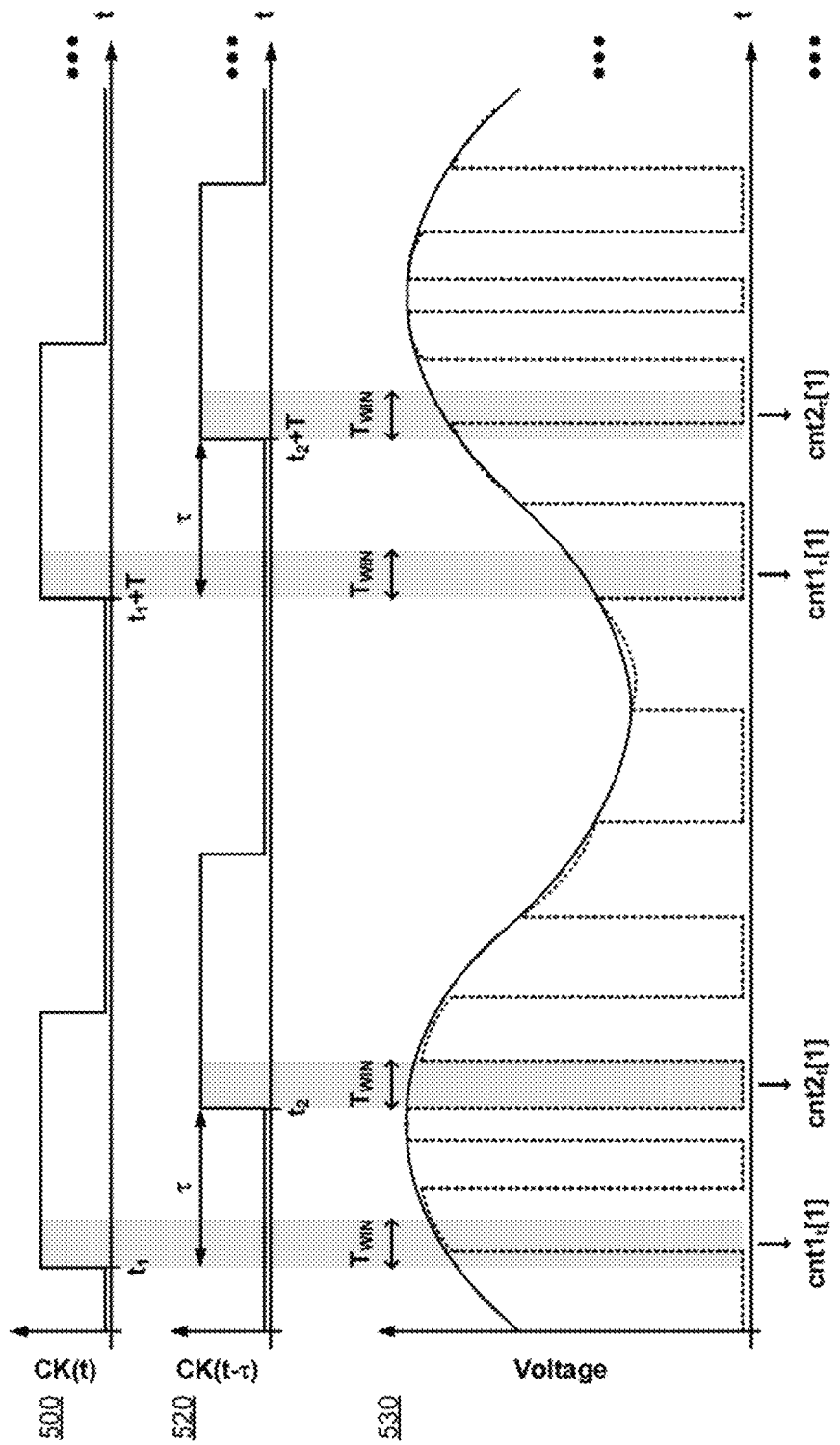
FIG. 5 illustrates waveforms for autocorrelation measurement with sub sampled averaging technique, according to some embodiments of the disclosure.

FIG. 5 illustrates waveforms 500, 520, and 530 for autocorrelation measurement with subsampled averaging technique, according to some embodiments of the disclosure. It is pointed out that those elements of FIG. 5 having the same reference numbers (or names) as the elements of any other figure can operate or function in any manner similar to that described, but are not limited to such. Here, x-axis is time and y-axis is voltage.

In some embodiments, the autocorrelation function technique can measure the power spectrum of non-repetitive noise waveforms with high-accuracy and high-bandwidth when the noise frequency components within the measurement bandwidth satisfy the criteria of a stationary random process. In some embodiments, this criteria of a stationary random process is: (1) The mean of a random process is a constant for all t, $E[V_N(t_1)]=E[V_N(t_2)]$=constant; and (2) the autocorrelation function of a random process depends only on the time difference, $R(t_1, t_2)=R(t_2-t_1)=R(\tau)$).

Waveform 530 illustrates an example of the autocorrelation measurement with the subsampled averaging technique. Contrary to the equivalent-time measurements, the autocorrelation measurement uses two low-resolution VCO-based ADCs (i.e., ADCs 102a/b) and two sampling clocks, CK(t) and CK(t–τ) as illustrated by waveforms 500 and 520, respectively. Here, the time-domain variable, τ, is defined by the time difference between the two sampling clocks.

Similar to the equivalent-time measurements, each certain autocorrelation-function sampling point, R(τ), is a statistical or averaging result of 'M' subsampled data. However, now each subsampled data is the product of two uncorrelated low-resolution VCO-based ADCs (i.e., ADCs 102a/b) outputs based on the definition of the autocorrelation function:

$$R(\tau) = E[V_N(t_1) \cdot V_N(t_2)], \quad t_2 - t_1 = \tau \quad (2)$$
$$= E[(V_N(t_1) + V_Q(t_1)) \cdot (V_N(t_2) + V_Q(t_2))], \quad t_2 - t_1 = \tau$$
$$= K_R \cdot \sum_{n=1}^{M} (cnt1_\tau[n] \cdot cnt2_\tau[n])$$

In some embodiments, the quantization-noise terms of the ADCs, $V_Q(t_1)$ and $V_Q(t_2)$, are embedded in $cnt1_\tau[n]$ and $cnt2_\tau[n]$, respectively, but they are filtered out due to their uncorrelated behavior with each other and the PSN, $V_N(t_1)$ and $V_N(t_2)$.

Figure 6A:
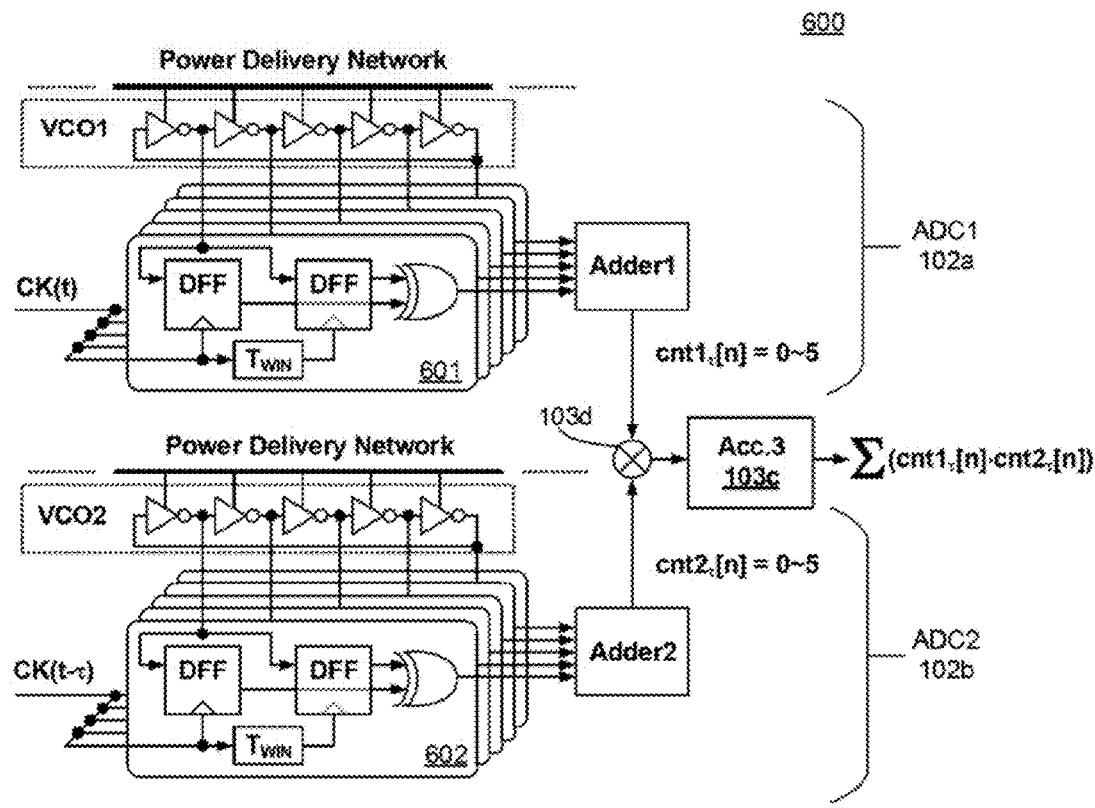
FIG. 6A illustrates a block diagram of a higher resolution oscillator based analog to digital converter (ADC) for autocorrelation measurement by the PSN analyzer, according to some embodiments of the disclosure.

FIG. 6A illustrates a block diagram of an apparatus 600 for autocorrelation measurement by PSN analyzer 100, according to some embodiments of the disclosure. It is pointed out that those elements of FIG. 6A having the same reference numbers (or names) as the elements of any other figure can operate or function in any manner similar to that described, but are not limited to such.

In some embodiments, apparatus 600 is a higher resolution oscillator based ADC for autocorrelation measurement by PSN analyzer 100. In some embodiments, apparatus 600 illustrates an implementation of VCO based ADC1 102a (also shown in FIG. 3A) and VCO based ADC2 102b with their outputs multiplied by multiplier 103d. In some embodiments, ADC 102a comprises VCO1 formed as ring oscillator that provides different phases to different copies of circuit 601. In some embodiments, circuit 601 samples the data from the VCO using CK(t). The noise on PDN changes or modulates the oscillating frequency of the VCO1 phases and those phases when sampled using CK(t), indirectly sample the noise on the PDN. In some embodiments, outputs of the different copies of circuit 601 are added together by Adder1 to form $cnt1_\tau[n]$.

Circuit 601 is similar to circuit described with reference to FIG. 3A. Referring back to FIG. 6A, in some embodiments, ADC2 102b comprises VCO2 formed as ring oscillator that provides different phases to different copies of circuit 602. Circuit 602 samples the data from the VCO2 using CK(t–τ). The noise on PDN changes or modulates the oscillating frequency of the VCO2 phases and those phases when sampled using CK(t–τ), indirectly sample the noise on the PDN. In some embodiments, outputs of the different copies of circuit 602 are added together to form cnt2$_T$[n]. In some embodiments, outputs cnt1$_T$[n] and cnt2$_T$[n] are multiplied by multiplier 103d and the resulting product is provided to accumulator 3 (Acc. 3) 103c.

In some embodiments, the edge transitions of multiple VCO outputs are checked and summarized locally to enhance the sensitivities of the ADCs, and then each of the subsampled results, cnt1$_T$[n] and cnt2$_T$[n], are sent to the PSN core for the multiplication and accumulation. In some embodiments, the operations of edge detection, local summation, multiplication and one-data accumulation are performed within one sampling clock period (e.g., 1 MHz).

Figure 6B:
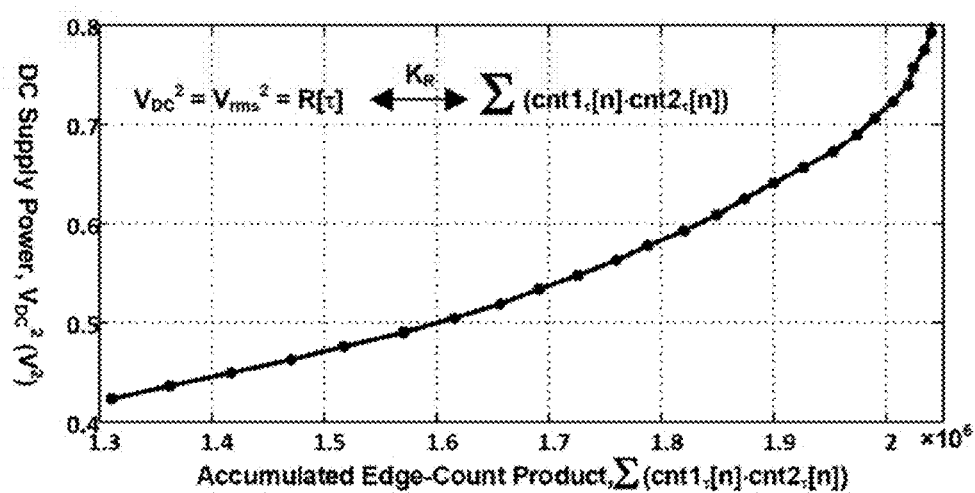
FIG. 6B illustrates a plot showing measured conversion curve between DC supply power and accumulated edge-count product, according to some embodiments of the disclosure.

FIG. 6B illustrates a plot 620 showing measured conversion curve between DC supply power and accumulated edge-count product, according to some embodiments of the disclosure. It is pointed out that those elements of FIG. 6B having the same reference numbers (or names) as the elements of any other figure can operate or function in any manner similar to that described, but are not limited to such. In some embodiments, the conversion gain, $K_R$, between accumulated edge-count product and autocorrelation function can be extracted by calibrating the accumulator outputs versus DC supply power as shown in plot 620.

FIG. 7A illustrates waveforms 700 showing the stationary process criteria violation due to frequency and phase synchronizations. It is pointed out that those elements of FIG. 7A having the same reference numbers (or names) as the elements of any other figure can operate or function in any manner similar to that described, but are not limited to such.

Theoretically, the sampling clocks, CK(t) and CK(t–τ), are assumed to be uncorrelated with the noise waveform to hold the stationary process criteria valid in the autocorrelation measurement mode. Waveforms 700 show an example of the stationary process violation due to the correlation between the sampling clocks CK(t) and CK(t–τ) and PSN $V_N$(t). The assumption is that a noise component and sampling clocks are synchronous, so every subsampled point for $V_N$(t$_1$) is sampled at the same location of the noise waveform within each subsampling period, T. $V_N$(t$_2$) has the same situation as well.

This immediately indicates the violation of the first stationary process criterion since E[$V_N$(t$_1$)] and E[$V_N$(t$_2$)] would be not equal for all t, only for t$_2$=t$_1$+nT, where 'T' is the clock period and 'n' is a non-zero integer. This clock-and-noise correlation issue is avoided if the reference clock, CKIN, is generated externally, in accordance to some embodiments. However, to further enable in-situ PSN measurement and efficient silicon characterizations for fast time-to-market, the reference clock is generated or leveraged from an on-die system clock, in accordance with some embodiments.

One issue is that the system clock itself is one of the primary PSN sources since it is usually driving the entire digital circuits under the PDN. Basically, the on-die digital-system operations are correlated to this system clock, and this correlation between PSN and reference clock (or sampling clocks) corrupts the autocorrelation measurements as shown by waveforms 700.

FIG. 7B illustrates waveforms 720 showing phase noise integration on the sampling clocks to meet the stationary process criteria. It is pointed out that those elements of FIG. 7B having the same reference numbers (or names) as the elements of any other figure can operate or function in any manner similar to that described, but are not limited to such.

In some embodiments, integrated phase noise is added to the sampling clocks CK(t) and CK(t–τ) to force uncorrelated sampling between the sampling clocks and PSN $V_N$(t). As such, the apparatus of some embodiments enables mimicking of the behavior of an analog free-running VCO in the digital domain. In some embodiments, the correlation between the noise frequency components and sampling clocks is scrambled by integrating phase noise over time. In some embodiments, the phase-noise integration behavior is emulated with a digital pseudo-random binary sequence (PRBS) generator and counter-based accumulator as described with reference to FIG. 9.

In some embodiments, Phase Rotator 106 generates proper clock phases for CK(t) and CK(t–τ) based on the reference clock CKIN and phase selection signals. In some embodiments, the output of Phase Noise Accumulator 105 is added to both phase selection signals to scramble the clock period. In some embodiments, while the output of Phase Noise Accumulator 105 is added to both phase selection signals, the two sampling clocks CK(t) and CK(t–τ) are maintained by a constant phase difference, τ, and their phases are shifted together to collect the subsampled data as shown by waveform 720. For a certain τ, the subsampling instances of CK(t) and CK(t–τ) can be expressed as:

$$t_1[n] = t_1 + \sum_{i=1}^{n} T_i = t_1 + \sum_{i=1}^{n}(T + j_i) = \qquad (3)$$

$$t_1 + \sum_{i=1}^{n}(T + N_i \cdot T_{LSB}) = t_1 + n \cdot T + \sum_{i=1}^{n}(N_i \cdot T_{LSB})$$

$$t_2[n] = \tau + t_1[n] = t_2 + n \cdot T + \sum_{i=1}^{n}(N_i \cdot T_{LSB}) \qquad (4)$$

where 'T' is the default sampling clock period and can synchronized with some PSN frequency components; and "$N_i$" is an integer number from the PRBS generator output (i.e., phase-noise source).

In some embodiments, the scrambling process has no effect on any clock-synchronized noise greater than 1/T$_{LSB}$ frequency (e.g., about 40 GHz) which is usually well beyond the noise bandwidth of the PDN (i.e., within a few hundreds of MHz). One reason for the above technical effect is that the scrambling capability of PSN analyzer 100 may be regulated by the resolution of Phase Rotator 106, T$_{LSB}$, since each phase-noise accumulation is $N_i \cdot T_{LSB}$. As such, this randomized phase-noise accumulation can force uncorrelated sampling within entire PDN bandwidth.

In the autocorrelation measurement mode, there may be at least two types of correlation issues between PSN and the sampling clocks CK(t) and CK(t–τ) without considering phase noise. These correlation issues are frequency and phase synchronizations, and only frequency synchronization.

FIGS. 8A-H illustrate plots that utilize a single tone with its autocorrelation functions and power spectrums as an example to illustrate the effects due to these two types of stationary process criteria violations.

FIG. 8A illustrates plot 800 showing the ideal autocorrelation function of a normalized sine wave as a cosine wave. FIG. 8B illustrates plot 820 showing the ideal power spectrum of the cosine wave of plot 800. Here, the power spectrum is a $0.5V_{rms}^2$ single tone without any other frequency component. In some embodiments, if PSN and sampling clocks are both frequency and phase synchronized as shown in FIG. 7A, the phase offset ($t_1$) between the sampling clocks CK(t) and CK(t-τ) and PSN can be a deterministic variable.

FIG. 8C illustrates plot 830 showing erroneous autocorrelation functions, of the cosine wave of plot 800, due to frequency synchronization and deterministic phase variable. Here, the autocorrelation function becomes a function of the phase offset ($t_1$). FIG. 8D illustrates plot 840 showing erroneous power spectrums, of the cosine wave of plot 800, due to frequency synchronization and deterministic phase variable. Here, the measured signal power can vary from −100% to 100% based on different phase offsets.

FIG. 8E illustrates plot 850 showing the erroneous autocorrelation function, of the cosine wave of plot 800, due to frequency synchronization and stochastic phase variable. If the PSN and sampling clocks CK(t) and CK(t-τ) are frequency synchronized without any phase noise, the phase offset ($t_1$) can be a stochastic (or random) variable. In this example, the phase offset ($t_1$) of each τ is set as a random variable uniformly distributed from 0 to T. In other examples, τ is set to any other distributions based on realistic measurement conditions. This randomized phase offset introduces a noise component on the top of the autocorrelation function as shown by plot 850. FIG. 8F illustrates plot 860 showing the erroneous power spectrum, of the cosine wave of plot 800, due to frequency synchronization and stochastic phase variable.

FIG. 8G illustrates plot 870 showing autocorrelation functions, of the cosine wave of plot 800, in which the correlation effects with a deterministic phase variable are suppressed by adding integrated phase noise, according to some embodiments. FIG. 8H illustrates plot 880 showing the autocorrelation function, of the cosine wave of plot 800, in which the correlation effects with a stochastic phase variable are suppressed by adding integrated phase noise, according to some embodiments.

The two types of frequency synchronizations with deterministic and stochastic phase-offset models (as described with reference to FIGS. 8C-F) may mix together and simultaneously affect measured power magnitudes and noise floors. In some embodiments, by adding integrated phase noise to the sampling clocks as illustrated in FIG. 7B, the effects of the correlation issues are both suppressed as shown in FIG. 8G and FIG. 8H compared to FIG. 8C and FIG. 8E, respectively. In some embodiments, with the phase-noise integration, the amount of errors in both power magnitude and noise floor can be reduced by increasing the number of collected data points (i.e., averaging).

Figure 9A:
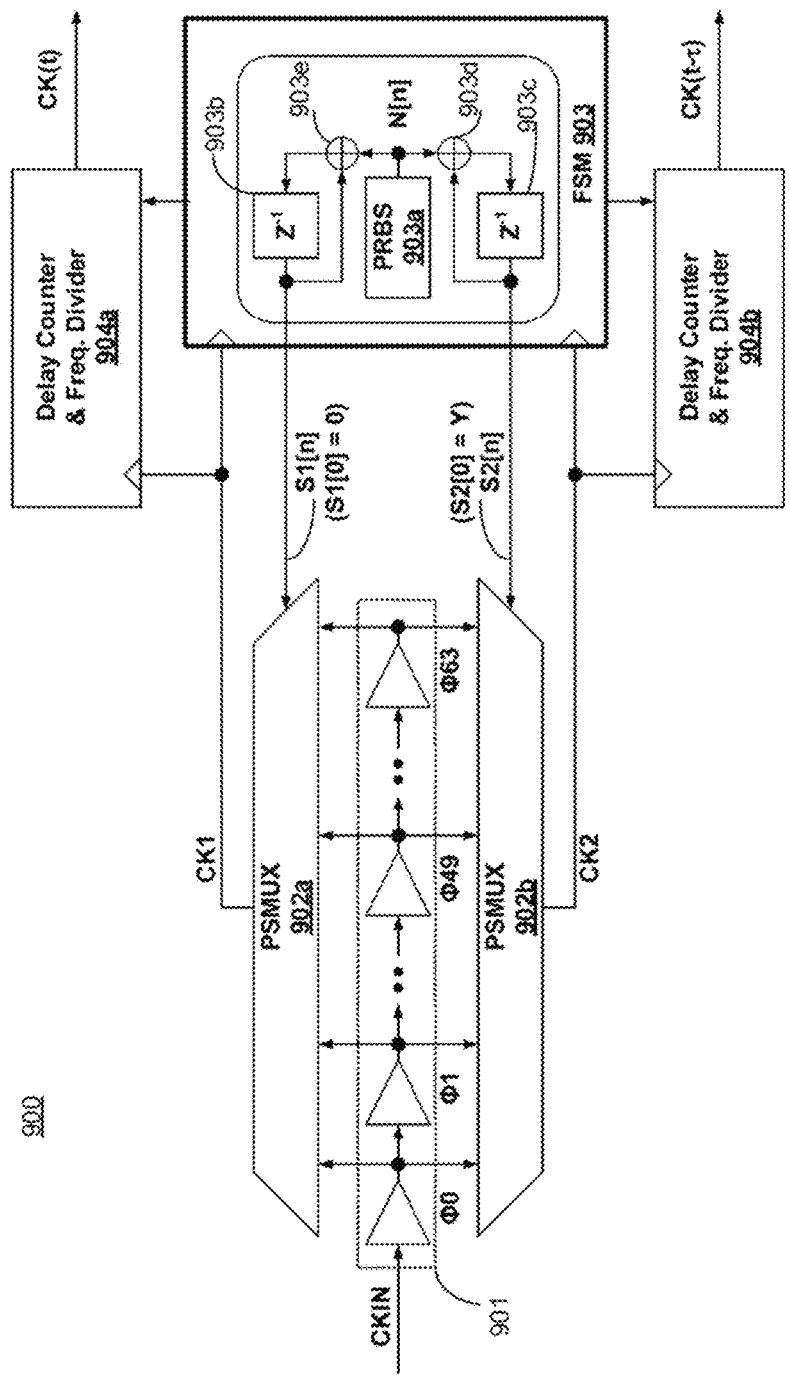
FIG. 9A illustrates a block diagram of a time-base generator of the PSN analyzer, according to some embodiments of the disclosure.

FIG. 9A illustrates a block diagram of a Time-based Generator 900/104 of PSN analyzer 100, according to some embodiments of the disclosure. It is pointed out that those elements of FIG. 9A having the same reference numbers (or names) as the elements of any other figure can operate or function in any manner similar to that described, but are not limited to such.

Figure 9B:
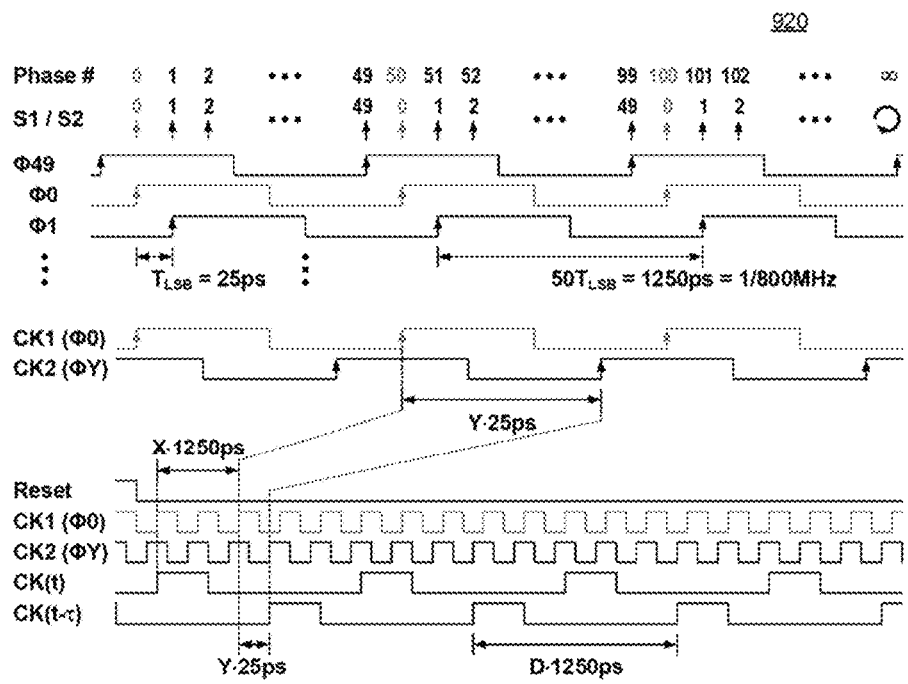
FIGS. 9B-C illustrates timing diagram showing the operation of the time-base generator of the PSN analyzer, according to some embodiments of the disclosure.
Figure 9C:
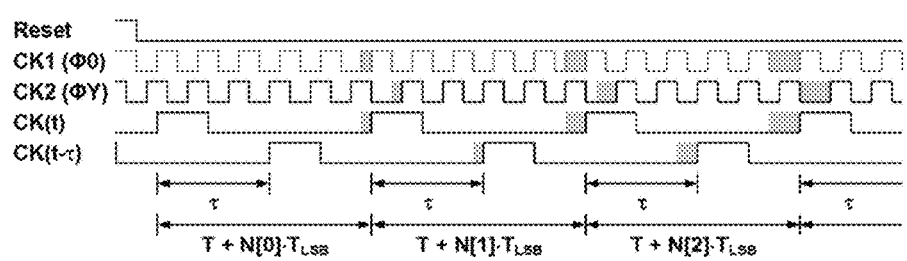

In some embodiments, Time-based Generator 900/104 comprises delay line 901, phase selection multiplexers (PSMUX) 902a and 902b, Finite State Machine (FSM) 903, Delay Counter and Frequency (Freq.) Divider 904a, and Delay Counter and Frequency (Freq.) Divider 904b. FIGS. 9B-C illustrates timing diagrams 920 and 930 showing the operation of Time-based Generator 900/104 of PSN analyzer 100, according to some embodiments of the disclosure.

In some embodiments, PSMUX 902a is controlled by S1[n] which is generated by FSM 903. In some embodiments, PSMUX 902b is controlled by S2[n] which is generated by FSM 903. In some embodiments, PSMUX 902a and PSMUX 902b receive phase signals from delay line 901 which receives CKIN as input. In some embodiments, the output of PSMUX 902a is CK1 which is then received by Delay Counter and Freq. Divider 904a to generate CK(t). In some embodiments, the output of PSMUX 902b is CK2 which is then received by Delay Counter and Freq. Divider 904b to generate CK(t-τ).

In some embodiments, the phase selection signals S1[n] and S2[n] are generated by FSM 903 which includes PRBS 903a, delay units 903b/c, and adders 903e/d. In some embodiments, delay unit 903b and adder 903e together form a digital accumulator that emulates phase accumulation of a free running oscillator, and so random period is provided to CK(t). In some embodiments, delay unit 903c and adder 903d together form a digital accumulator that emulates phase accumulation of a free running oscillator as well, and so random period is provided to CK(t-τ).

In some embodiments, the phase selection signals S1[n] and S2[n] are confined within 0 to 49 to pick PSMUX outputs from one of Φ0 to Φ49. In one example, because of 800 MHz periodicity and 25 ps $T_{LSB}$, (Φ50 to Φ99), (Φ100 to Φ149), . . . can be correspondingly represented by (Φ0~Φ49) to implement an infinite phase sequence from the very first Φ0 standpoint as shown in FIG. 9B.

In some embodiments, PSMUX outputs, CK1 and CK2 having the same period (e.g., 50·$T_{LSB}$) but different phases selected from Φ0 to Φ49, are fed into two frequency dividers (divisor=D) with their own delay counters to generate the final sampling clocks CK(t) and CK(t-τ) (e.g., 1 MHz clocks) as shown in FIG. 9A and FIG. 9B. The autocorrelation time variable, τ, is jointly contributed by the Delay Counters 904a/b and Phase Rotator 106.

For example, τ=X·(50·$T_{LSB}$)+Y·($T_{LSB}$), where X is the difference between the two delay counters settings, Y is the difference between the two PSMUX selections, S1[n] and S2[n], and where both X and Y are integers greater than or equal to zero. In some embodiments, in the equivalent-time and impedance measurements, the accumulators in FIG. 9A are bypassed (i.e., X and Y are directly set by FSM 903). Here, the accumulators are 903b and 903e; and 903c and 903d. In some embodiments, either CK(t) or CK(t-τ) can be used to sample PSN, and the equivalent-time variable, t in FIG. 2, can be generated by the same approach of τ.

In some embodiments, when the phase-noise accumulation is enabled in the autocorrelation measurements, two requirements are maintained: (1) a constant τ over entire averaging process; (2) infinite phase-noise accumulation.

In some embodiments, to hold the first requirement, X and Y settings are kept constant over entire subsampled data collection process regardless the phase-noise accumulation ON or OFF. For example, each specific τ can have 1 million subsampled points, and (S2[n]-S1[n]) is a constant for n=0 to 999999 even though S1[n] and S2[n] are the functions of the discrete subsampled data index, 'n'. In some embodiments, the '13' (e.g., less than 10) consecutive binary-bit words are taken from a 10th-order PRBS generator 903a to represent a noise signal, N[n], uniformly distributed from 0 to $2^B$−1. In some embodiments, N[n] is added to both PSMUX selection signals S1[n] and S2[n] to keep the phase difference constant for all 'n', i.e. Y=S2[n+1]−S1[n+1]=(S2[n]+N[n])−(S1[n]+N[n]).

In some embodiments, the infinite phase-noise accumulation is implemented based on Eq. (3) by adding two terms to the current sampling instance: nominal sampling clock period T (=D·50·$T_{LSB}$), and a phase-shift N[n]·$T_{LSB}$ as shown in FIG. 9C. In some embodiments, the first term will be automatically added due to the nature of a periodic clock, but an accumulator is used for each PSMUX to shift sampling instance by extra N[n]·$T_{LSB}$.

As shown in FIG. 9B, in some embodiments, the initial condition of the accumulators are set to 0 and Y, respectively, and the actual value of the phase selection signals are based on the accumulator outputs 'modulo' the rollover threshold (e.g., 50) decided by delay cell calibration. In some embodiments, even though Phase Rotator 106 has limited phase options (Φ0 to Φ49), this finite range accumulator still can offer infinite phase noise accumulations due to the nature of the infinite phase rotator and the incremental accumulation approach.

In some embodiments, the incremental accumulation approach splits the N[n] accumulation into 'N' reference clock (CKIN) cycles instead of one. As such, even though N[n] is larger than the rollover threshold, the N[n]·$T_{LSB}$ phase-shift can be implemented correctly. For example, S2[n]=49, N[n]=52, and rollover threshold is 50. The incremental accumulator adds N[n] to S2[n] over 52 cycles, the accumulator output will follow the sequence [49, 0, 1, 2, ..., 49, 0, 1] and finally stop at 1, instead of 101, to select Φ1. Even though Φ1 has been selected twice in this incremental switching, it actually moves the divider output clock phase, CK(t−τ), by 52·$T_{LSB}$. In some embodiments, because of the incremental accumulation, the phase relationship can be maintained even though S2[n+1] may be smaller than S1[n+1] due to the accumulator rollover.

For example, S1[n]=39, S2[n]=49, and N[n]=4. Then, S1[n+1] is 43, but S2[n+1] is 3 instead of 53 (i.e., CK1 and CK2 will be respectively driven by Φ43 and Φ3). Even so, the incremental accumulation can be based on the current phase, Φ49, to correctly pick next rising edge of Φ3 which is equivalent to Φ53.

In some cases, any instantaneous glitch on CK1 or CK2 may cause extra counts in the divider and force the rising edge of CK(t) or CK(t−τ) to occur prematurely.

FIG. 10A illustrates a circuit diagram of a glitch-free phase switching multiplexer 1000 of time-based generator, according to some embodiments of the disclosure. It is pointed out that those elements of FIG. 10A having the same reference numbers (or names) as the elements of any other figure can operate or function in any manner similar to that described, but are not limited to such.

In some embodiments, glitch-free phase switching multiplexer 1000 comprises DFF 1001, DFF 1002, DFF 1003, Even Multiplexer (MUX) 1004, Odd MUX 1005, and multiplexer 1006 coupled together as shown. In some embodiments, glitch-free phase switching multiplexer 1000 operates on the even-odd alternating selection approach. FIG. 10B illustrates timing diagram 1020 of the glitch-free phase switching multiplexer 1000, according to some embodiments of the disclosure.

In some embodiments, the PSMUX input signals are split into two groups of even (Φ0, Φ2, ..., Φ62) and odd (Φ1, Φ3, ..., Φ63) phases. In some embodiments, the final 2:1 MUX determines which group of outputs is going to be selected. In some embodiments, when the final output is shorted to the odd group output $\Phi_{ODD}$ and the odd group selection signal SO is hold, the even group selection signal SE is switched to the determined even phase which is the next phase of current $\Phi_{ODD}$.

In some embodiments, even if glitches occur during the phase transition at $\Phi_{EVEN}$, they do not appear at the final output driven by $\Phi_{ODD}$. The same procedure is done for the transition from even to odd phases. In some embodiments, the switching between $\Phi_{ODD}$ and $\Phi_{SEVEN}$ is glitch-free as well. This can be done by avoiding final MUX 1006 switching at the rising and falling edges of both $\Phi_{ODD}$ and $\Phi_{SEVEN}$.

In some embodiments, the final MUX 1006 is switched at the moment of TD after the rising edge of CK2. For example, as long as 25 ps<TD<625 ps, the PSMUX output can be glitch-free during phase switching. This mechanism is also applicable to the Φ49-to-Φ0 transition due to the phase rotation. Though this phase switching approach can shift the clock phase by one $T_{LSB}$ per switching, a multiple time-step switching can be done by consecutively shifting $T_{LSB}$ multiple times, in accordance to some embodiments. The incremental accumulation approach is realized by this manner for each N[n]. In some embodiments, each N[n]·$T_{LSB}$ phase-shift is done by N[n] cycles of the operation.

Figure 11A:
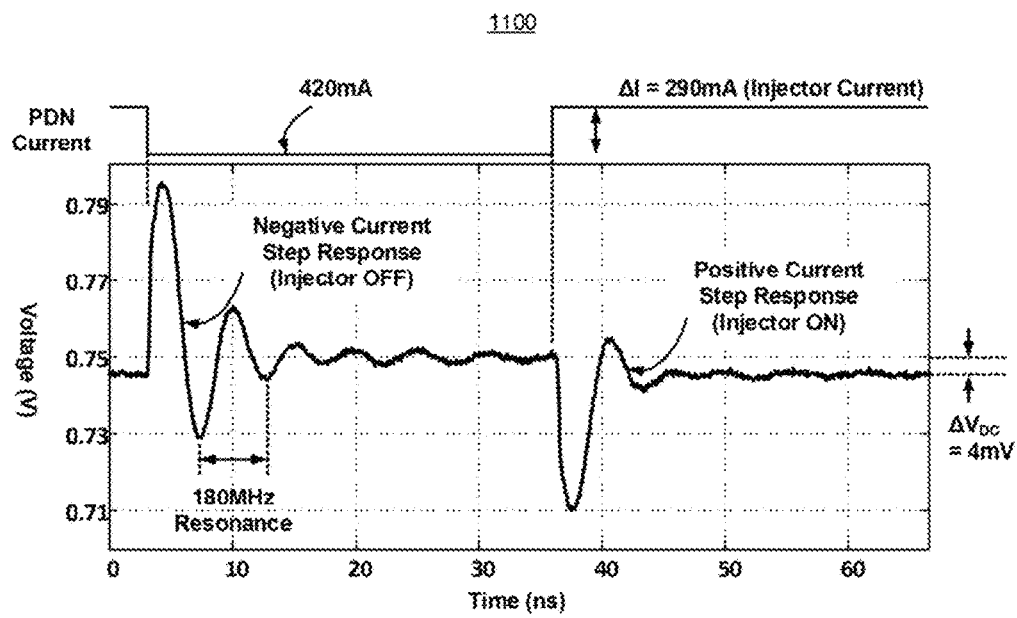
FIG. 11A illustrates a plot showing a measured step response waveform of the PDN using the PSN injector, according to some embodiments of the disclosure.

FIG. 11A illustrates plot 1100 showing a step response waveform of the PDN using PSN injector 101, according to some embodiments of the disclosure. It is pointed out that those elements of FIG. 11A having the same reference numbers (or names) as the elements of any other figure can operate or function in any manner similar to that described, but are not limited to such.

In the example of FIG. 11A, PSN injector 101 draws a 290 mA 15 MHz current pulse from the PDN. From the standpoint of the PDN resonant frequency, an almost ideal 15 MHz square-wave is provided as the driver input of PSN injector 101. The measured PSN waveform shows the step responses of the PDN due to both positive and negative current steps. The damping effect due to the resonance frequency and the impact of power state transitions on the power supply can be observed from this waveform as well. In this example, the 4 mV DC voltage drop due to the 290 mA DC current indicates the PDN series resistance, $R_{PDN}$, is about 0.014 Ohm.

Figure 11B:
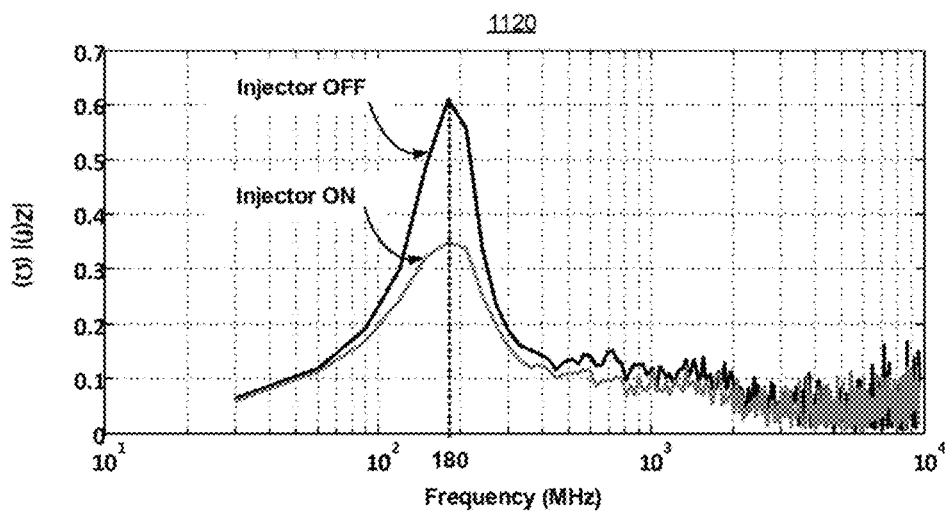
FIG. 11B illustrates a plot showing PDN impedance transfer functions with and without PSN injector being on, according to some embodiments of the disclosure.

FIG. 11B illustrates plot 1120 showing PDN impedance transfer functions with and without PSN injector 101 being turned on, according to some embodiments of the disclosure. It is pointed out that those elements of FIG. 11B having the same reference numbers (or names) as the elements of any other figure can operate or function in any manner similar to that described, but are not limited to such.

Figure 11C:
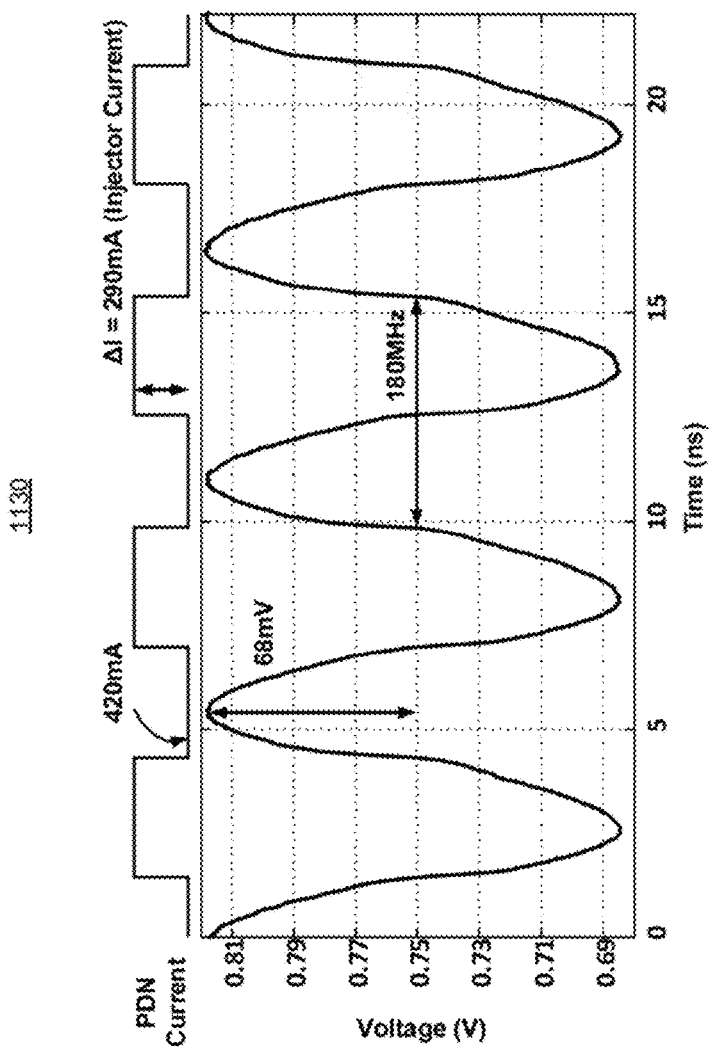
FIG. 11C illustrates a plot showing PSN waveform, according to some embodiments of the disclosure.

The PDN impedance transfer functions in plot 1120 are extracted from both positive and negative step responses shown in plot 1100. The discrepancies between the positive and negative step responses and their Q factors may be caused by the resistance loading effect, $R_{INJ}$, of PSN injector 101 described with reference to FIG. 4B. This result reflects different impedance characteristics due to the variation of the PDN load. The 180 MHz resonant frequency can be observed in both FIG. 11A and FIG. 11B. Instead of 15 MHz, in this example, PSN injector 101 draws a 290 mA 180 MHz current pulse from the PDN, and the measured equivalent-time waveform shows a distorted 180 MHz sinusoidal as illustrated by plot 1130 of FIG. 11C. Here, the fundamental tone amplitude is about 68 mV. In some embodiments, with software post processing, the measurement accuracy can be improved by increasing the averaging cycles (or subsampled data points). In one example, over a 32-million-cycle averaging per sample, the standard deviation of the measured supply voltage reaches 0.3 mV$_{rms}$ which is on the order of 1 mV accuracy.

Figure 12A:
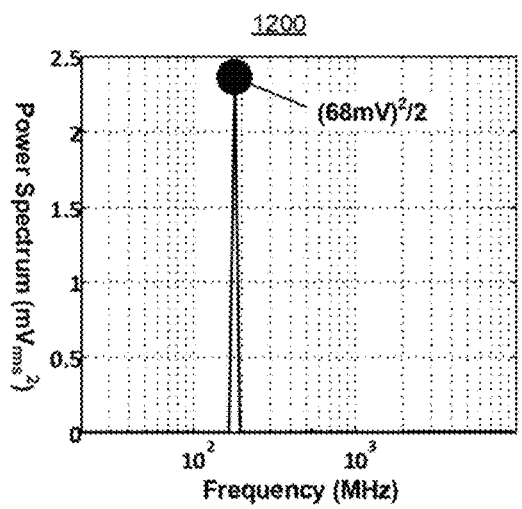
FIG. 12A illustrates a plot showing the power spectrum based on equivalent-time measurements with PSN injection.

FIG. 12A illustrates plot 1200 showing the power spectrum based on equivalent0time measurements with PSN injection. The power spectrum in plot 1200 is obtained from the equivalent-time measurement result shown in FIG. 11C. Since it is a synchronous and subsampled averaging measurement, all zero-mean and uncorrelated noise components are averaged out except the 180 MHz noise tone and its almost invisible harmonics on the V$_{rms}^2$ scale. In this example, at 180 MHz, plot 1200 shows 0.0023V$_{rms}^2$ signal power because of the 68 mV fundamental tone amplitude shown in FIG. 11C. In the autocorrelation measurement mode, the synchronization between CKIN and INJ normally has to be disabled.

Figure 12B:
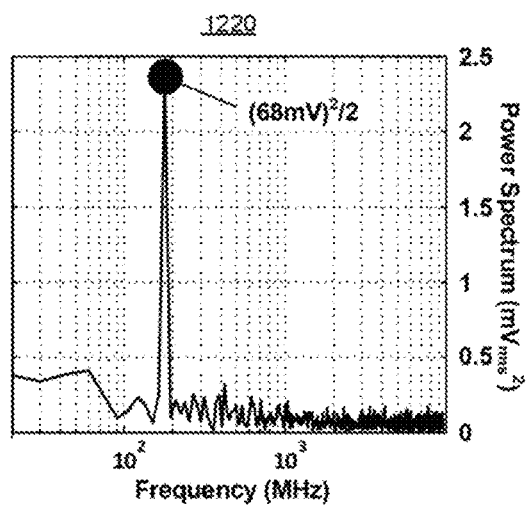
FIG. 12B illustrates a plot showing the power spectrum based on autocorrelation measurements without clock-synchronized noise.

FIG. 12B illustrates plot 1220 showing the power spectrum based on autocorrelation measurements without clock-synchronized noise. In this example, the measured PSN power spectrum in FIG. 12B covers the entire noise frequency components (noise floor) within the Nyquist frequency, and the power magnitude of the 180 MHz noise tone matches the equivalent-time measurement result. Here, to emulate the clock-and-noise correlation issue in realistic situations, the synchronization between CKIN and INJ is intentionally enabled in the autocorrelation measurement.

Figure 12C:
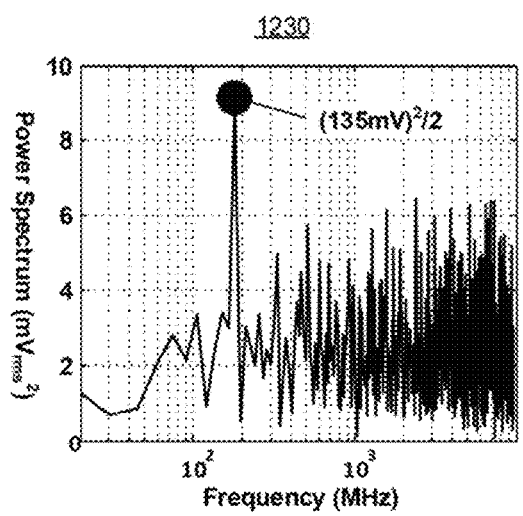
FIG. 12C illustrates a plot showing the power spectrum based on autocorrelation measurements with clock-synchronized noise.

FIG. 12C illustrates plot 1230 showing the power spectrum measurements based on autocorrelation measurements with clock-synchronized noise. Plot 1230 shows the erroneous result in terms of noise power and noise floor due to the violation of the stationary process criteria. The incorrect power magnitude and noise floor are combinational effects due to the deterministic and stochastic variables of the phase offset between PSN and sampling clocks when their frequency are synchronized. The problem shown in plot 1230 are fixed by turning on the random phase-noise accumulation mechanism according to some embodiments.

Figure 12D:
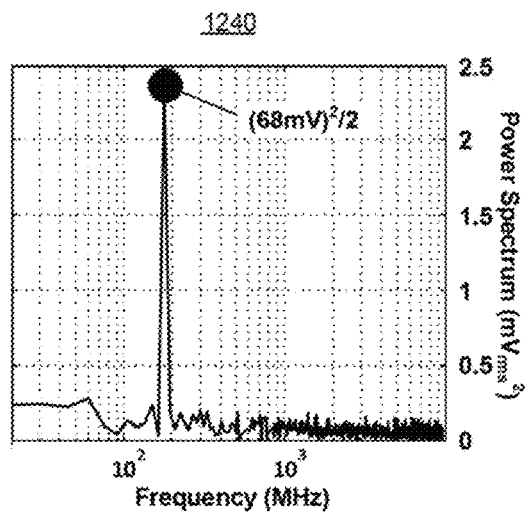
FIG. 12D illustrates a plot showing the power spectrum based on autocorrelation measurements with clock-synchronized noise and random phase-noise accumulation mechanism, according to some embodiments of the disclosure.

FIG. 12D illustrates a plot 1240 showing the power spectrum based on autocorrelation measurements with clock-synchronized noise and random phase-noise accumulation mechanism, according to some embodiments of the disclosure. As shown by plot 1240, in this example, since this subsampled averaging system meets the criteria of the stationary random process again, the power spectrum measurement result is corrected, and the 180 MHz noise power difference between FIG. 12B and FIG. 12D is less than 2%. This result confirms that PSN analyzer 100 has the capability to immunize the power spectrum measurements against any correlated PSN within the measurement bandwidth. Plot 1240 also confirms that PSN analyzer 100 can enable fully in-situ PSN measurements without extra external reference clock sources and clean supplies.

Figure 13:
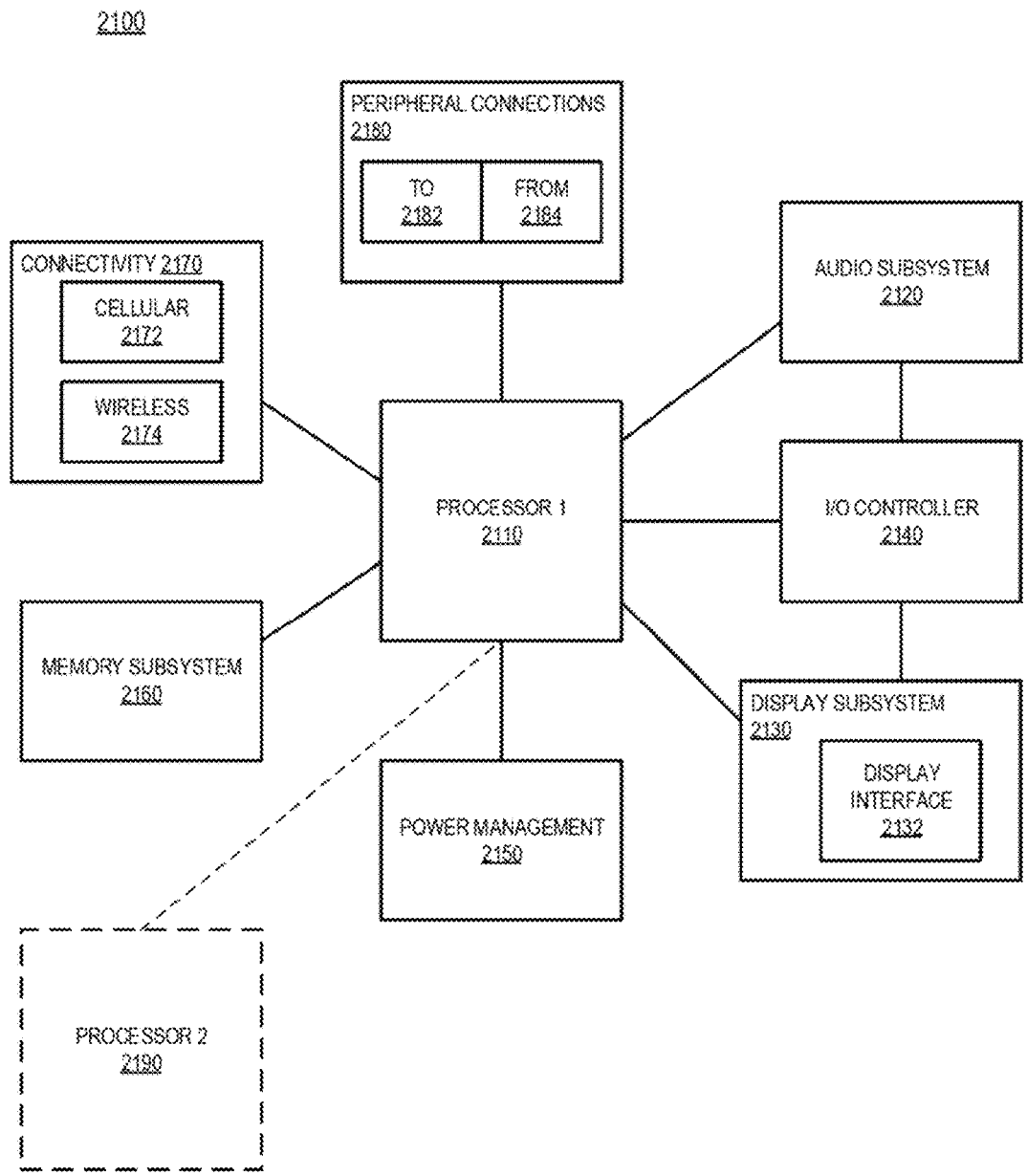
FIG. 13 illustrates a smart device or a computer system or a SoC (System-on-Chip) having the PSN analyzer, according to some embodiments.

FIG. 13 illustrates a smart device or a computer system or a SoC (System-on-Chip) having PSN analyzer 100, according to some embodiments. It is pointed out that those elements of FIG. 13 having the same reference numbers (or names) as the elements of any other figure can operate or function in any manner similar to that described, but are not limited to such.

FIG. 13 illustrates a block diagram of an embodiment of a mobile device in which flat surface interface connectors could be used. In some embodiments, computing device 2100 represents a mobile computing device, such as a computing tablet, a mobile phone or smart-phone, a wireless-enabled e-reader, or other wireless mobile device. It will be understood that certain components are shown generally, and not all components of such a device are shown in computing device 2100.

In some embodiments, computing device 2100 includes a first processor 2110 with PSN analyzer 100, according to some embodiments discussed. Other blocks of the computing device 2100 may also include PSN analyzer 100 of some embodiments. The various embodiments of the present disclosure may also comprise a network interface within 2170 such as a wireless interface so that a system embodiment may be incorporated into a wireless device, for example, cell phone or personal digital assistant.

In one embodiment, processor 2110 (and/or processor 2190) can include one or more physical devices, such as microprocessors, application processors, microcontrollers, programmable logic devices, or other processing means. The processing operations performed by processor 2110 include the execution of an operating platform or operating system on which applications and/or device functions are executed. The processing operations include operations related to I/O (input/output) with a human user or with other devices, operations related to power management, and/or operations related to connecting the computing device 2100 to another device. The processing operations may also include operations related to audio I/O and/or display I/O.

In one embodiment, computing device 2100 includes audio subsystem 2120, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 2100, or connected to the computing device 2100. In one embodiment, a user interacts with the computing device 2100 by providing audio commands that are received and processed by processor 2110.

Display subsystem 2130 represents hardware (e.g., display devices) and software (e.g., drivers) components that provide a visual and/or tactile display for a user to interact with the computing device 2100. Display subsystem 2130 includes display interface 2132, which includes the particular screen or hardware device used to provide a display to a user. In one embodiment, display interface 2132 includes logic separate from processor 2110 to perform at least some processing related to the display. In one embodiment, display subsystem 2130 includes a touch screen (or touch pad) device that provides both output and input to a user.

I/O controller 2140 represents hardware devices and software components related to interaction with a user. I/O controller 2140 is operable to manage hardware that is part of audio subsystem 2120 and/or display subsystem 2130. Additionally, I/O controller 2140 illustrates a connection point for additional devices that connect to computing device 2100 through which a user might interact with the system. For example, devices that can be attached to the computing device 2100 might include microphone devices, speaker or stereo systems, video systems or other display devices, keyboard or keypad devices, or other I/O devices for use with specific applications such as card readers or other devices.

As mentioned above, I/O controller 2140 can interact with audio subsystem 2120 and/or display subsystem 2130. For example, input through a microphone or other audio device can provide input or commands for one or more applications or functions of the computing device 2100. Additionally, audio output can be provided instead of, or in addition to display output. In another example, if display subsystem 2130 includes a touch screen, the display device also acts as an input device, which can be at least partially managed by I/O controller 2140. There can also be additional buttons or switches on the computing device 2100 to provide I/O functions managed by I/O controller 2140.

In one embodiment, I/O controller 2140 manages devices such as accelerometers, cameras, light sensors or other environmental sensors, or other hardware that can be included in the computing device 2100. The input can be part of direct user interaction, as well as providing environmental input to the system to influence its operations (such as filtering for noise, adjusting displays for brightness detection, applying a flash for a camera, or other features).

In one embodiment, computing device 2100 includes power management 2150 that manages battery power usage, charging of the battery, and features related to power saving operation. Memory subsystem 2160 includes memory devices for storing information in computing device 2100. Memory can include nonvolatile (state does not change if power to the memory device is interrupted) and/or volatile (state is indeterminate if power to the memory device is interrupted) memory devices. Memory subsystem 2160 can store application data, user data, music, photos, documents, or other data, as well as system data (whether long-term or temporary) related to the execution of the applications and functions of the computing device 2100.

Elements of embodiments are also provided as a machine-readable medium (e.g., memory 2160) for storing the computer-executable instructions (e.g., instructions to implement any other processes discussed herein). The machine-readable medium (e.g., memory 2160) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 2170 includes hardware devices (e.g., wireless and/or wired connectors and communication hardware) and software components (e.g., drivers, protocol stacks) to enable the computing device 2100 to communicate with external devices. The computing device 2100 could be separate devices, such as other computing devices, wireless access points or base stations, as well as peripherals such as headsets, printers, or other devices.

Connectivity 2170 can include multiple different types of connectivity. To generalize, the computing device 2100 is illustrated with cellular connectivity 2172 and wireless connectivity 2174. Cellular connectivity 2172 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 2174 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 2180 include hardware interfaces and connectors, as well as software components (e.g., drivers, protocol stacks) to make peripheral connections. It will be understood that the computing device 2100 could both be a peripheral device ("to" 2182) to other computing devices, as well as have peripheral devices ("from" 2184) connected to it. The computing device 2100 commonly has a "docking" connector to connect to other computing devices for purposes such as managing (e.g., downloading and/or uploading, changing, synchronizing) content on computing device 2100. Additionally, a docking connector can allow computing device 2100 to connect to certain peripherals that allow the computing device 2100 to control content output, for example, to audiovisual or other systems.

In addition to a proprietary docking connector or other proprietary connection hardware, the computing device 2100 can make peripheral connections 2180 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. For example, other memory architectures e.g., Dynamic RAM (DRAM) may use the embodiments discussed. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, an apparatus which comprises a PDN to provide a power supply to at least one circuit; and an on-die synchronous power supply noise injector to inject noise to the power supply on the PDN. In some embodiments, the apparatus comprises an on-die PSN sampler to sample the power supply with an injected noise, wherein the PSN sampler to sample the power supply with at least two different clock signals. In some embodiments, the apparatus comprises a phase noise accumulator to randomize periods of the at least two different clock signals. In some embodiments, the phase noise accumulator comprises: a phase provider to provide phase signals; and a glitch-free phase selection multiplexer to receive the phase signals and to provide signals for generating the at least two different clock signals.

In some embodiments, the phase provider comprises a delay line with a plurality of delay elements to provide phase signals for the glitch-free phase selection multiplexer. In some embodiments, the apparatus a PRBS generator coupled to the phase provider. In some embodiments, the PRBS generator is a phase noise source. In some embodiments, the PRBS generator generates signals for controlling the glitch-free phase selection multiplexer. In some embodiments, the apparatus comprises at least two digital accumulators coupled to the PRBS generator, wherein the at least two digital accumulators to generate two selection signals for controlling the glitch-free phase selection multiplexer. In some embodiments, the phase noise accumulator to adjust a phase difference between the at least two different clock signals.

In some embodiments, the on-die synchronous power supply noise injector is operable to inject a step noise to the power supply. In some embodiments, the apparatus comprises logic which is operable to differentiate a response of the step noise to generate an impulse response. In some embodiments, the apparatus comprises logic which is operable to perform discrete Fourier transform of the impulse response to generate an impedance profile of the PDN.

In another example, a system is provided which comprises: a memory; a processor coupled to the memory, the processor comprising an apparatus according to the apparatus described above; and a wireless interface for allowing the processor to communicate with another device.

In another example, an apparatus is provided which comprises: a PDN to provide a power supply to at least one circuit; an on-die PSN sampler to sample the power supply with an injected noise, wherein the PSN sampler to sample the power supply with at least two different clock signals; and a phase noise accumulator to randomize the periods of the at least two different clock signals. In some embodiments, the apparatus comprises an on-die synchronous power supply noise injector to inject noise to the power supply on the PDN.

In some embodiments, the on-die synchronous power supply noise injector is operable to inject a step noise to the power supply. In some embodiments, the apparatus comprises logic which is operable to differentiate a response of the step noise to generate an impulse response. In some embodiments, the apparatus logic which is operable to perform discrete Fourier transform of the impulse response to generate an impedance profile of the PDN.

In another example, a system is provided which comprises: a memory; a processor coupled to the memory, the processor comprising an apparatus according to the apparatus described above; and a wireless interface for allowing the processor to communicate with another device.

In another example, a method is provided which comprises: providing a power supply to at least one circuit via a PDN; and injecting noise to the power supply on the PDN. In some embodiments, the method comprises sampling the power supply with an injected noise, with at least two different clock signals. In some embodiments, the method comprises randomizing periods of the at least two different clock signals. In some embodiments, the method comprises: providing phase signals; receiving, by a glitch-free phase selection multiplexer, the phase signals; and providing signals for generating the at least two different clock signals.

In some embodiments, the method comprises generating signals for controlling the glitch-free phase selection multiplexer. In some embodiments, the method comprises injecting a step noise to the power supply. In some embodiments, the method comprises differentiating a response of the step noise to generate an impulse response. In some embodiments, the method comprises performing discrete Fourier transform of the impulse response to generate an impedance profile of the PDN.

In another example, an apparatus is provided which comprises: a PDN for providing a power supply to at least one circuit; and means for injecting noise to the power supply on the PDN. In some embodiments, the apparatus comprises means for sampling the power supply with an injected noise, with at least two different clock signals. In some embodiments, the apparatus comprises means for randomizing periods of the at least two different clock signals.

In some embodiments, the apparatus comprises: means for providing phase signals; a glitch-free phase selection multiplexer for receiving the phase signals; and means for providing signals for generating the at least two different clock signals. In some embodiments, the apparatus comprises means for generating signals for controlling the glitch-free phase selection multiplexer. In some embodiments, the apparatus comprises means for injecting a step noise to the power supply. In some embodiments, the apparatus comprises means for differentiating a response of the step noise to generate an impulse response. In some embodiments, the apparatus comprises means for performing discrete Fourier transform of the impulse response to generate an impedance profile of the PDN.

In another example, a system is provided which comprises: a memory; a processor coupled to the memory, the processor comprising an apparatus according to the apparatus described above; and a wireless interface for allowing the processor to communicate with another device.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:
1. An apparatus comprising:
a first circuitry to intentionally randomize of at least two different clocks; and
a second circuitry to sample a power supply, wherein the power supply has an injected noise, and wherein the second circuitry is to sample the power supply using the at least two different clocks with randomized periods,
wherein the at least two different clocks have respective random frequencies.

2. The apparatus of claim 1, wherein the first circuitry comprises a multiplexer to receive phase signals and to select one of the phase signals to generate the at least two different clocks.

3. The apparatus of claim 2, wherein the first circuitry comprises a delay line to provide the phase signals to the multiplexer.

4. The apparatus of claim 2 comprises a third circuitry to generate a pseudorandom binary sequence to generate a phase noise, wherein the phase noise is to control the multiplexer.

5. The apparatus of claim 1 comprises a fourth circuitry to inject the noise to the power supply.

6. The apparatus of claim 5, wherein the noise is a step noise.

7. The apparatus of claim 5, wherein the fourth circuitry comprises a digital-to-analog converter (DAC).

8. The apparatus of claim 7, wherein the DAC is combined with a pattern generator.

9. The apparatus of claim 1, wherein the second circuitry includes an oscillator based analog-to-digital converter (ADC).

10. The apparatus of claim 1 comprises:
a power delivery network (PDN) to provide the power supply to a circuit; and
a power supply noise injector to inject noise to the power supply to the PDN.

11. An apparatus comprising:
a first circuitry to randomize periods of at least two different clocks, wherein the first circuitry comprises:
a delay line having a plurality of delay stages, wherein the delay line is to receive an input clock;
a first multiplexer coupled to the delay line to select a first clock phase from among a plurality of clock phases of the input clock generated by the delay line; and
a second multiplexer coupled to the delay line to select a second clock phase from among the plurality of clock phases of the input clock generated by the delay line, wherein the first clock phase is different from the second clock phase; and
a second circuitry to sample a power supply, wherein the power supply has an injected noise, and wherein the second circuitry is to sample the power supply using first and second clocks derived from the first and second clock phases,
wherein the at least two different clocks have respective random frequencies.

12. The apparatus of claim 11, wherein the first and second multiplexers are controlled by a third circuitry that is to receive the first and second clock phases.

13. The apparatus of claim 12 comprises a first counter to receive the first clock phase, wherein the first counter is controlled by the third circuitry.

14. The apparatus of claim 13 comprises a second counter to receive the second clock phase, wherein the second counter is controlled by the third circuitry.

15. The apparatus of claim 14, wherein the first and second counters are to generate the first and second clocks, respectively, for the second circuitry to sample the power supply.

16. The apparatus of claim 15, wherein the second circuitry includes a first oscillator based analog-to-digital converter (ADC) to receive the first clock, and a second oscillator based ADC to receive the second clock.

17. A system comprising:
a memory;
a processor coupled to the memory, the processor including an apparatus which comprises:
a first circuitry to intentionally randomize of at least two different clocks; and
a second circuitry to sample a power supply, wherein the power supply has an injected noise, and wherein the second circuitry is to sample the power supply using the at least two different clocks, wherein the at least two different clocks have respective random frequencies; and
a wireless interface to allow the processor to communicate with another device.

18. The system of claim 17, wherein:
the first circuitry comprises:
a multiplexer to receive phase signals and to select one of the phase signals to generate the at least two different clocks; and
a delay line to provide the phase signals to the multiplexer; and
the system comprises:
a third circuitry to generate a pseudorandom binary sequence to generate a phase noise, wherein the phase noise is to control the multiplexer; and
a fourth circuitry to inject the noise to the power supply.

19. The apparatus of claim 11 comprises a finite state machine to control the first and second multiplexers.

20. The apparatus of claim 11 comprises:
a power delivery distribution network (PDN) to provide the power supply to at least one circuit; and
a power supply noise injector to inject step noise to the power supply.

21. The apparatus of claim 20, wherein:
the power supply noise injector is positioned on-die;
the power supply noise injector is synchronous; and
the power supply noise injector is to adjust an amplitude of the injected noise.

* * * * *